United States Patent
Ryner et al.

(10) Patent No.: US 12,372,807 B2
(45) Date of Patent: *Jul. 29, 2025

(54) HYPEREXTENDING HINGE FOR WEARABLE ELECTRONIC DEVICE

(71) Applicant: Snap Inc., Santa Monica, CA (US)

(72) Inventors: Michael Ryner, Santa Monica, CA (US); Stephen Steger, Los Angeles, CA (US)

(73) Assignee: Snap Inc., Santa Monica, CA (US)

( * ) Notice: Subject to any disclaimer, the term of this patent is extended or adjusted under 35 U.S.C. 154(b) by 27 days.

This patent is subject to a terminal disclaimer.

(21) Appl. No.: 18/399,378

(22) Filed: Dec. 28, 2023

(65) Prior Publication Data

US 2024/0126099 A1   Apr. 18, 2024

Related U.S. Application Data

(63) Continuation of application No. 16/793,249, filed on Feb. 18, 2020, now Pat. No. 11,880,093.

(51) Int. Cl.
| | | |
|---|---|---|
| *G02C 5/22* | (2006.01) | |
| *G02C 11/00* | (2006.01) | |
| *H05K 1/18* | (2006.01) | |

(52) U.S. Cl.
CPC ......... *G02C 5/2227* (2013.01); *G02C 5/2245* (2013.01); *G02C 11/10* (2013.01); *H05K 1/189* (2013.01)

(58) Field of Classification Search
CPC .... G02C 5/2227; G02C 11/10; G02C 5/2245; G02C 5/2236; G02C 5/2218; H05K 1/189

USPC ............................................. 351/113
See application file for complete search history.

(56) References Cited

U.S. PATENT DOCUMENTS

| | | |
|---|---|---|
| 2,874,609 A | 2/1959 | Marcello |
| 3,644,023 A | 2/1972 | Luciano |
| 4,494,834 A | 1/1985 | Tabacchi |
| 5,165,060 A | 11/1992 | Huang |
| 5,406,339 A | 4/1995 | Chen |
| 5,751,393 A | 5/1998 | Yamazaki |
| 5,755,010 A | 5/1998 | Lehnert |
| 5,818,567 A | 10/1998 | Sakai |

(Continued)

FOREIGN PATENT DOCUMENTS

| | | |
|---|---|---|
| CN | 2470851 | 1/2002 |
| CN | 101075020 A | 11/2007 |

(Continued)

OTHER PUBLICATIONS

2nd Chinese Office Action for Chinese Application No. 202180015356. 0, dated Apr. 27, 2024 (Apr. 7, 2024)—7 pages (English translation—3 pages).

(Continued)

*Primary Examiner* — George G. King
(74) *Attorney, Agent, or Firm* — CM Law; Stephen J. Weed

(57) ABSTRACT

Eyewear having a frame, a hinge, and a hyperextendable temple. An extender is coupled to the hinge and the temple, and the extender extends with respect to the hinge allowing hyperextension of the temple with respect to the frame. The extender may include a bushing and a spring that allows the temple hyperextension, and which also creates a bias force to urge the temple against a user's head during use.

20 Claims, 20 Drawing Sheets

(56) References Cited

U.S. PATENT DOCUMENTS

| | | | |
|---|---|---|---|
| 5,889,575 | A | 3/1999 | Wang |
| 10,353,221 | B1 | 7/2019 | Graff et al. |
| 11,327,338 | B1 | 5/2022 | Brown |
| 11,378,817 | B2 | 7/2022 | Ryner et al. |
| 11,543,679 | B2 | 1/2023 | Ryner et al. |
| 11,880,093 | B2 * | 1/2024 | Ryner ................ G02B 27/0176 |
| 2005/0078272 | A1 | 4/2005 | Quehin |
| 2005/0217073 | A1 | 10/2005 | Wagner |
| 2007/0089268 | A1 | 4/2007 | Genelot |
| 2007/0200998 | A1 | 8/2007 | Schrimmer et al. |
| 2015/0131048 | A1 | 5/2015 | Iurilli |
| 2016/0048036 | A1 | 2/2016 | Cazalet |
| 2016/0054585 | A1 | 2/2016 | Alcini |
| 2016/0091732 | A1 | 3/2016 | Wang |
| 2019/0198981 | A1 | 6/2019 | Moore et al. |
| 2021/0103146 | A1 | 4/2021 | Travers et al. |
| 2021/0240007 | A1 | 8/2021 | Hicks et al. |

FOREIGN PATENT DOCUMENTS

| | | | |
|---|---|---|---|
| CN | 204479852 | U | 7/2015 |
| CN | 206311855 | U | 7/2017 |
| CN | 208172407 | U | 11/2018 |
| CN | 109782447 | A | 5/2019 |
| DE | 2052269 | A1 | 4/1972 |
| EP | 239010 | A2 | 9/1987 |
| EP | 0395939 | A2 | 11/1990 |
| EP | 1666952 | A1 | 6/2006 |
| EP | 2597507 | A1 | 5/2013 |
| EP | 3001240 | A1 | 3/2016 |
| KR | 19990037760 | A | 5/1999 |

OTHER PUBLICATIONS

2nd Chinese Office Action for Chinese Application No. 202180015427.7, dated May 29, 2024 (May 9, 2024)—9 pages (English translation—3 pages).

International Search Report and Written Opinion for International Application No. PCT/US2021/014877, dated May 7, 2021 (May 7, 2021)—12 pages.

International Search Report and Written Opinion for International Application No. PCT/US2021/015009, dated May 7, 2021 (May 7, 2021)—13 pages.

International Search Report and Written Opinion for International Application No. PCT/US2021/015175, dated May 7, 2021 (May 7, 2021)—13 pages.

1st Chinese Office Action for CN Application No. 202180015453.X dated Dec. 14, 2024 (Dec. 14, 2024), 8 pages (English translation—3 pages).

* cited by examiner phrase# HYPEREXTENDING HINGE FOR WEARABLE ELECTRONIC DEVICE

CROSS-REFERENCE TO RELATED APPLICATIONS

This application is a Continuation of U.S. application Ser. No. 16/793,249 filed on Feb. 18, 2020, the contents of which are incorporated fully herein by reference.

TECHNICAL FIELD

The present subject matter relates to an eyewear device, e.g., smart glasses and see-through displays.

BACKGROUND

Portable eyewear devices, such as smart glasses, headwear, and headgear available today integrate cameras and see-through displays. Eyewear typically include a frame and temples that can be extended into an open position to allow placement about user's eyes.

BRIEF DESCRIPTION OF THE DRAWINGS

The drawing figures depict one or more implementations, by way of example only, not by way of limitations. In the figures, like reference numerals refer to the same or similar elements.

DETAILED DESCRIPTION

Figure 1A:
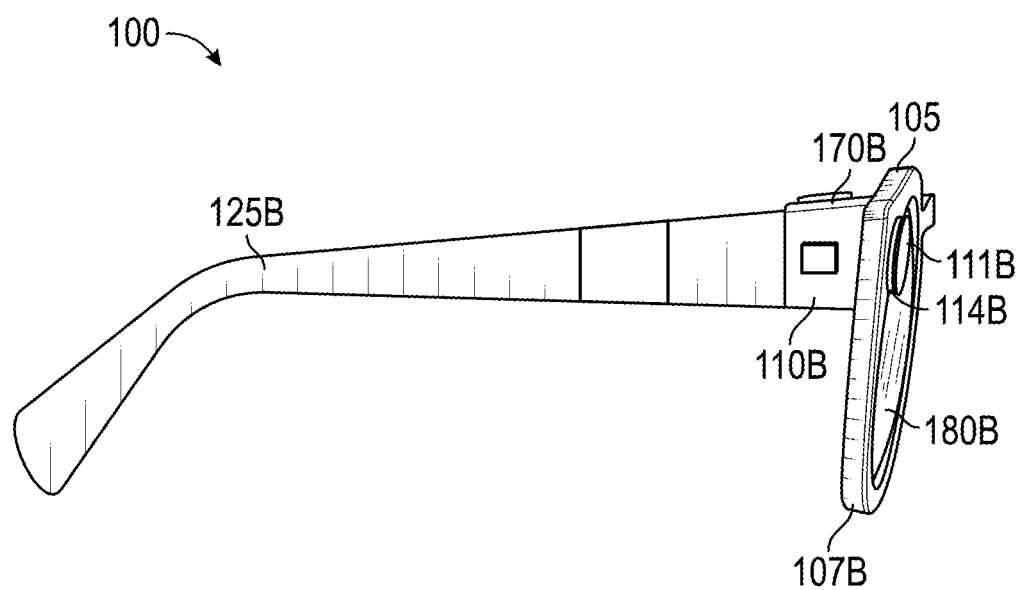
FIG. 1A is a side view of an example hardware configuration of an eyewear device, which shows a right optical assembly with an image display, and field of view adjustments are applied to a user interface presented on the image display based on detected head or eye movement by a user.

This disclosure is directed to eyewear having a frame, a hinge, and a hyperextendable temple. An extender is coupled to the hinge and the temple, and the extender extends with respect to the hinge allowing hyperextension of the temple with respect to the frame. The hinge is coupled to the frame, and a temple portion coupled to, or forming a part of, the frame may be interposed between the frame and the hinge. The extender may form a portion of the hinge. The extender may include a bushing and a spring that allows the temple hyperextension, and which also creates a bias force to urge the temple against a user's head during use.

Additional objects, advantages and novel features of the examples will be set forth in part in the description which follows, and in part will become apparent to those skilled in the art upon examination of the following and the accompanying drawings or may be learned by production or operation of the examples. The objects and advantages of the present subject matter may be realized and attained by means of the methodologies, instrumentalities and combinations particularly pointed out in the appended claims.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and circuitry have been described at a relatively high-level, without detail, in order to avoid unnecessarily obscuring aspects of the present teachings.

The term "coupled" as used herein refers to any logical, optical, physical or electrical connection, link or the like by which signals or light produced or supplied by one system element are imparted to another coupled element. Unless described otherwise, coupled elements or devices are not necessarily directly connected to one another and may be separated by intermediate components, elements or communication media that may modify, manipulate or carry the light or signals.

The orientations of the eyewear device, associated components and any complete devices incorporating an eye scanner and camera such as shown in any of the drawings, are given by way of example only, for illustration and discussion purposes. In operation for a particular variable optical processing application, the eyewear device may be oriented in any other direction suitable to the particular application of the eyewear device, for example up, down, sideways, or any other orientation. Also, to the extent used herein, any directional term, such as front, rear, inwards, outwards, towards, left, right, lateral, longitudinal, up, down, upper, lower, top, bottom and side, are used by way of example only, and are not limiting as to direction or orientation of any optic or component of an optic constructed as otherwise described herein.

Reference now is made in detail to the examples illustrated in the accompanying drawings and discussed below.

Figure 2A:
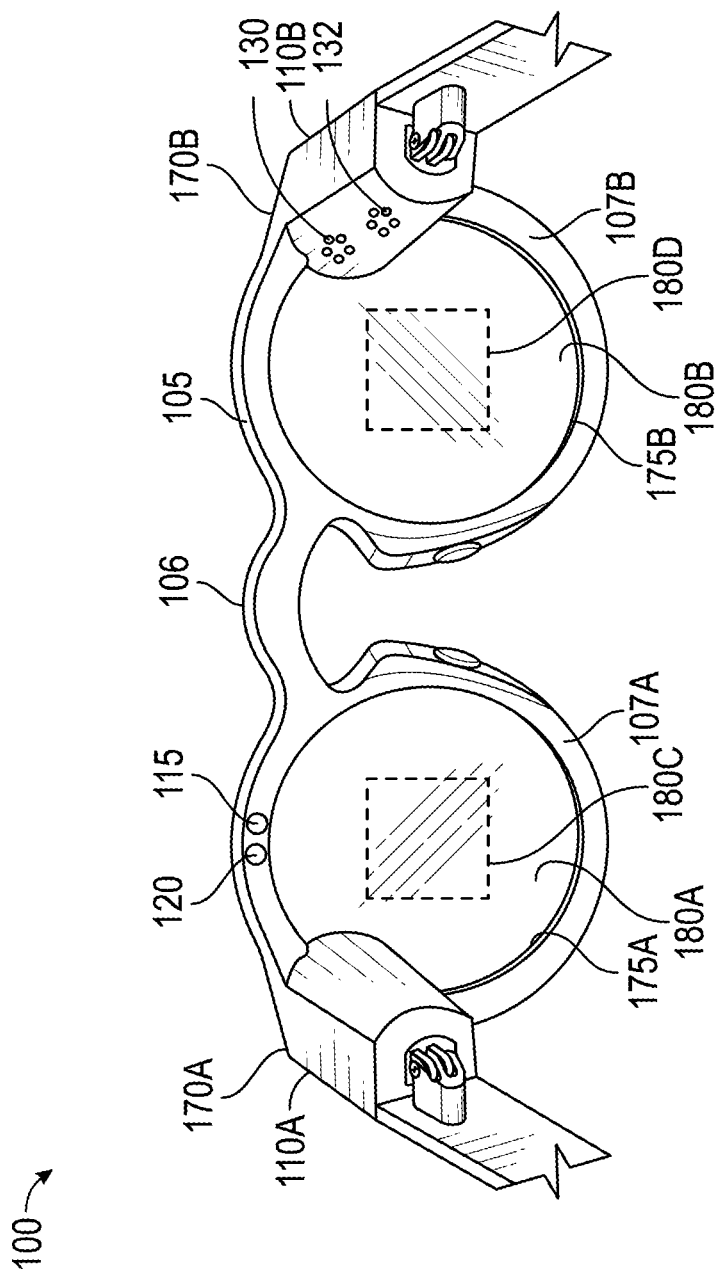
FIG. 2A is a rear view of an example hardware configuration of an eyewear device, which includes an eye scanner on a frame, for use in a system for identifying a user of the eyewear device.

FIG. 1A is a side view of an example hardware configuration of an eyewear device 100, which includes a right optical assembly 180B with an image display 180D (FIG. 2A). Eyewear device 100 includes multiple visible light cameras 114A-B (FIG. 7) that form a stereo camera, of which the right visible light camera 114B is located on a right temple 110B.

The left and right visible light cameras 114A-B have an image sensor that is sensitive to the visible light range wavelength. Each of the visible light cameras 114A-B have a different frontward facing angle of coverage, for example, visible light camera 114B has the depicted angle of coverage 111B. The angle of coverage is an angle range which the image sensor of the visible light camera 114A-B picks up electromagnetic radiation and generates images. Examples of such visible lights camera 114A-B include a high-resolution complementary metal-oxide-semiconductor (CMOS) image sensor and a video graphic array (VGA) camera, such as 640p (e.g., 640×480 pixels for a total of 0.3 megapixels), 720p, or 1080p. Image sensor data from the visible light cameras 114A-B are captured along with geolocation data, digitized by an image processor, and stored in a memory.

To provide stereoscopic vision, visible light cameras 114A-B may be coupled to an image processor (element 912 of FIG. 9) for digital processing along with a timestamp in which the image of the scene is captured. Image processor 912 includes circuitry to receive signals from the visible light camera 114A-B and process those signals from the visible light cameras 114A-B into a format suitable for storage in the memory (element 934 of FIG. 9). The timestamp can be added by the image processor 912 or other processor, which controls operation of the visible light cameras 114A-B. Visible light cameras 114A-B allow the stereo camera to simulate human binocular vision. Stereo cameras provide the ability to reproduce three-dimensional images (element 715 of FIG. 7) based on two captured images (elements 758A-B of FIG. 7) from the visible light cameras 114A-B, respectively, having the same timestamp. Such three-dimensional images 715 allow for an immersive life-like experience, e.g., for virtual reality or video gaming. For stereoscopic vision, the pair of images 758A-B are generated at a given moment in time—one image for each of the left and right visible light cameras 114A-B. When the pair of generated images 758A-B from the frontward facing angles of coverage 111A-B of the left and right visible light cameras 114A-B are stitched together (e.g., by the image processor 912), depth perception is provided by the optical assembly 180A-B.

In an example, a user interface field of view adjustment system includes the eyewear device 100. The eyewear device 100 includes a frame 105, a right temple 110B extending from a right lateral side 170B of the frame 105, and a see-through image display 180D (FIGS. 2A-B) comprising optical assembly 180B to present a graphical user interface to a user. The eyewear device 100 includes the left visible light camera 114A connected to the frame 105 or the left temple 110A to capture a first image of the scene. Eyewear device 100 further includes the right visible light camera 114B connected to the frame 105 or the right temple 110B to capture (e.g., simultaneously with the left visible light camera 114A) a second image of the scene which partially overlaps the first image. Although not shown in FIGS. 1A-B, the user interface field of view adjustment system further includes the processor 932 coupled to the eyewear device 100 and connected to the visible light cameras 114A-B, the memory 934 accessible to the processor 932, and programming in the memory 934, for example in the eyewear device 100 itself or another part of the user interface field of view adjustment system.

Figure 1B:
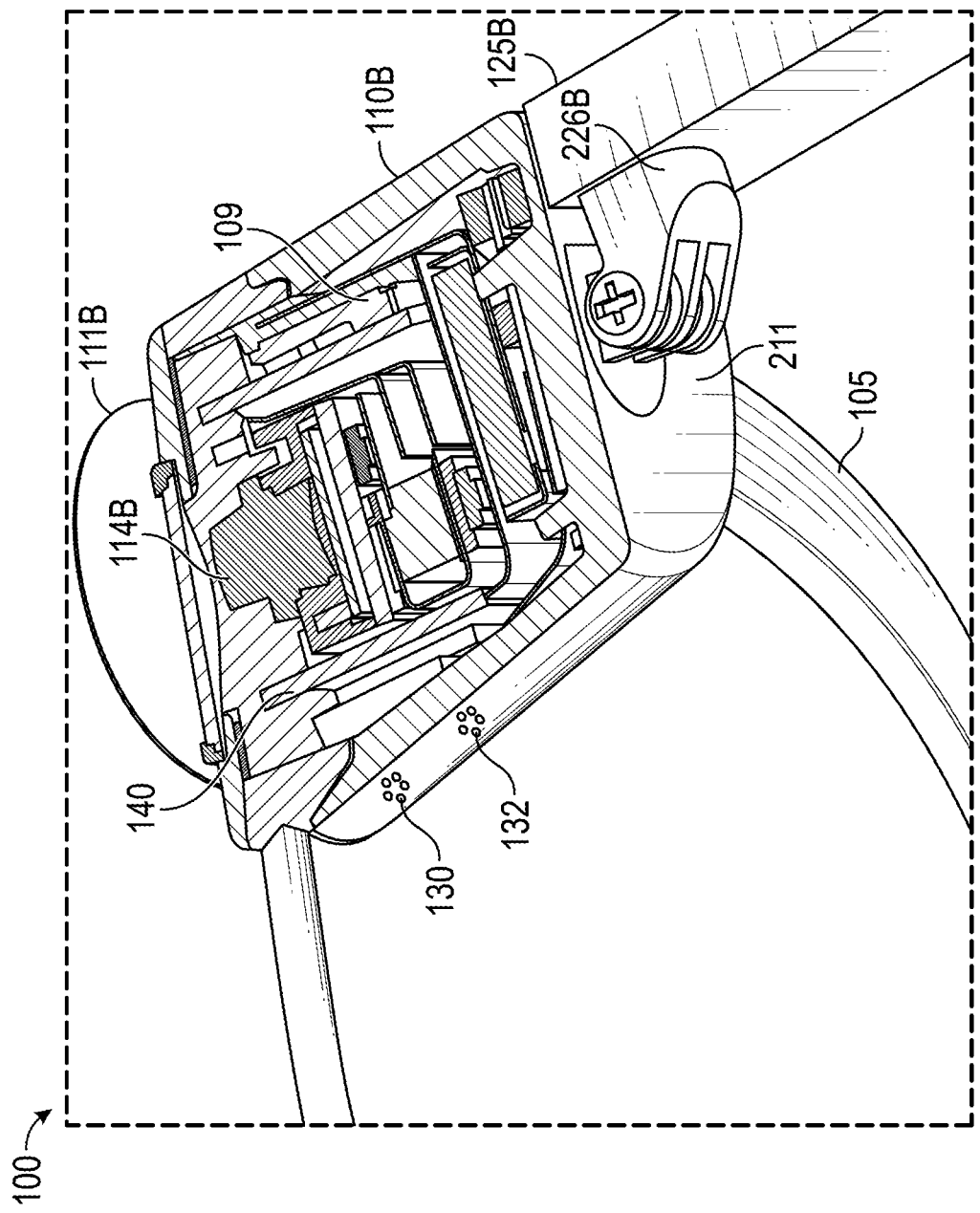
FIG. 1B is a top cross-sectional view of a temple of the eyewear device of FIG. 1A depicting a visible light camera, a head movement tracker for tracking the head movement of the user of the eyewear device, and a circuit board.
Figure 2B:
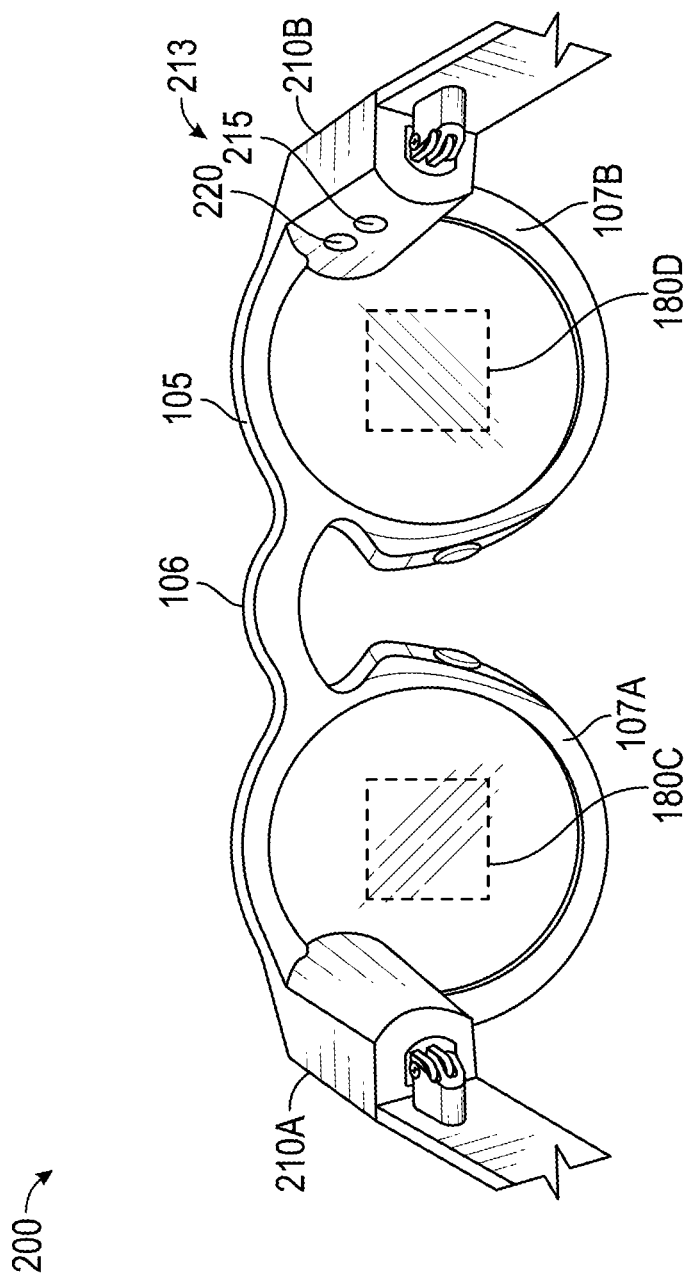
FIG. 2B is a rear view of an example hardware configuration of another eyewear device, which includes an eye scanner on a temple, for use in a system for identifying a user of the eyewear device.

Although not shown in FIG. 1A, the eyewear device 100 also includes a head movement tracker (element 109 of FIG. 1B) or an eye movement tracker (element 213 of FIG. 2B). Eyewear device 100 further includes the see-through image displays 180C-D of optical assembly 180A-B for presenting a sequence of displayed images, and an image display driver (element 942 of FIG. 9) coupled to the see-through image displays 180C-D of optical assembly 180A-B to control the image displays 180C-D of optical assembly 180A-B to present the sequence of displayed images 715, which are described in further detail below. Eyewear device 100 further includes the memory 934 and the processor 932 having access to the image display driver 942 and the memory 934. Eyewear device 100 further includes programming (element 934 of FIG. 9) in the memory. Execution of the programming by the processor 932 configures the eyewear device 100 to perform functions, including functions to present, via the see-through image displays 180C-D, an initial displayed image of the sequence of displayed images, the initial displayed image having an initial field of view corresponding to an initial head direction or an initial eye gaze direction (element 230 of FIG. 5).

Execution of the programming by the processor 932 further configures the eyewear device 100 to detect movement of a user of the eyewear device by: (i) tracking, via the head movement tracker (element 109 of FIG. 1B), a head movement of a head of the user, or (ii) tracking, via an eye movement tracker (element 213 of FIG. 2B, FIG. 5), an eye movement of an eye of the user of the eyewear device 100. Execution of the programming by the processor 932 further configures the eyewear device 100 to determine a field of view adjustment to the initial field of view of the initial displayed image based on the detected movement of the user. The field of view adjustment includes a successive field of view corresponding to a successive head direction or a successive eye direction. Execution of the programming by the processor 932 further configures the eyewear device 100 to generate a successive displayed image of the sequence of displayed images based on the field of view adjustment.

Execution of the programming by the processor 932 further configures the eyewear device 100 to present, via the see-through image displays 180C-D of the optical assembly 180A-B, the successive displayed images.

FIG. 1B is a top cross-sectional view of the temple of the eyewear device 100 of FIG. 1A depicting the right visible light camera 114B, a head movement tracker 109, and a circuit board. Construction and placement of the left visible light camera 114A is substantially similar to the right visible light camera 114B, except the connections and coupling are on the left lateral side 170A. As shown, the eyewear device 100 includes the right visible light camera 114B and a circuit board, which may be a flexible printed circuit board (PCB) 140. The right hinge 226B connects the right temple 110B to a right temple 125B of the eyewear device 100. In some examples, components of the right visible light camera 114B, the flexible PCB 140, or other electrical connectors or contacts may be located on the right temple 125B or the right hinge 226B.

As shown, eyewear device 100 has a head movement tracker 109, which includes, for example, an inertial measurement unit (IMU). An inertial measurement unit is an electronic device that measures and reports a body's specific force, angular rate, and sometimes the magnetic field surrounding the body, using a combination of accelerometers and gyroscopes, sometimes also magnetometers. The inertial measurement unit works by detecting linear acceleration using one or more accelerometers and rotational rate using one or more gyroscopes. Typical configurations of inertial measurement units contain one accelerometer, gyro, and magnetometer per axis for each of the three axes: horizontal axis for left-right movement (X), vertical axis (Y) for top-bottom movement, and depth or distance axis for up-down movement (Z). The accelerometer detects the gravity vector. The magnetometer defines the rotation in the magnetic field (e.g., facing south, north, etc.) like a compass which generates a heading reference. The three accelerometers to detect acceleration along the horizontal, vertical, and depth axis defined above, which can be defined relative to the ground, the eyewear device 100, or the user wearing the eyewear device 100.

Eyewear device 100 detects movement of the user of the eyewear device 100 by tracking, via the head movement tracker 109, the head movement of the head of the user. The head movement includes a variation of head direction on a horizontal axis, a vertical axis, or a combination thereof from the initial head direction during presentation of the initial displayed image on the image display. In one example, tracking, via the head movement tracker 109, the head movement of the head of the user includes measuring, via the inertial measurement unit 109, the initial head direction on the horizontal axis (e.g., X axis), the vertical axis (e.g., Y axis), or the combination thereof (e.g., transverse or diagonal movement). Tracking, via the head movement tracker 109, the head movement of the head of the user further includes measuring, via the inertial measurement unit 109, a successive head direction on the horizontal axis, the vertical axis, or the combination thereof during presentation of the initial displayed image.

Tracking, via the head movement tracker 109, the head movement of the head of the user further includes determining the variation of head direction based on both the initial head direction and the successive head direction. Detecting movement of the user of the eyewear device 100 further includes in response to tracking, via the head movement tracker 109, the head movement of the head of the user, determining that the variation of head direction exceeds a deviation angle threshold on the horizontal axis, the vertical axis, or the combination thereof. The deviation angle threshold is between about 3° to 10°. As used herein, the term "about" when referring to an angle means ±10% from the stated amount.

Variation along the horizontal axis slides three-dimensional objects, such as characters, Bitmojis®, application icons, etc. in and out of the field of view by, for example, hiding, unhiding, or otherwise adjusting visibility of the three-dimensional object. Variation along the vertical axis, for example, when the user looks upwards, in one example, displays weather information, time of day, date, calendar appointments, etc. In another example, when the user looks downwards on the vertical axis, the eyewear device 100 may power down.

The right temple 110B includes temple body 211 and a temple cap, with the temple cap omitted in the cross-section of FIG. 1B. Disposed inside the right temple 110B are various interconnected circuit boards, such as PCBs or flexible PCBs, that include controller circuits for right visible light camera 114B, microphone(s) 130, speaker(s) 132, low-power wireless circuitry (e.g., for wireless short-range network communication via Bluetooth™), high-speed wireless circuitry (e.g., for wireless local area network communication via WiFi).

The right visible light camera 114B is coupled to or disposed on the flexible PCB 240 and covered by a visible light camera cover lens, which is aimed through opening(s) formed in the right temple 110B. In some examples, the frame 105 connected to the right temple 110B includes the opening(s) for the visible light camera cover lens. The frame 105 includes a front-facing side configured to face outwards away from the eye of the user. The opening for the visible light camera cover lens is formed on and through the front-facing side. In the example, the right visible light camera 114B has an outward facing angle of coverage 111B with a line of sight or perspective of the right eye of the user of the eyewear device 100. The visible light camera cover lens can also be adhered to an outward facing surface of the right temple 110B in which an opening is formed with an outwards facing angle of coverage, but in a different outwards direction. The coupling can also be indirect via intervening components.

Left (first) visible light camera 114A is connected to the left see-through image display 180C of left optical assembly 180A to generate a first background scene of a first successive displayed image. The right (second) visible light camera 114B is connected to the right see-through image display 180D of right optical assembly 180B to generate a second background scene of a second successive displayed image. The first background scene and the second background scene partially overlap to present a three-dimensional observable area of the successive displayed image.

Flexible PCB 140 is disposed inside the right temple 110B and is coupled to one or more other components housed in the right temple 110B. Although shown as being formed on the circuit boards of the right temple 110B, the right visible light camera 114B can be formed on the circuit boards of the left temple 110A, the temples 125A-B, or frame 105.

FIG. 2A is a rear view of an example hardware configuration of an eyewear device 100, which includes an eye scanner 113 on a frame 105, for use in a system for determining an eye position and gaze direction of a wearer/user of the eyewear device 100. As shown in FIG. 2A, the eyewear device 100 is in a form configured for wearing by a user, which are eyeglasses in the example of FIG. 2A. The eyewear device 100 can take other forms and may incorporate other types of frameworks, for example, a headgear, a headset, or a helmet.

In the eyeglasses example, eyewear device 100 includes the frame 105 which includes the left rim 107A connected to the right rim 107B via the bridge 106 adapted for a nose of the user. The left and right rims 107A-B include respective apertures 175A-B which hold the respective optical element 180A-B, such as a lens and the see-through displays 180C-D. As used herein, the term lens is meant to cover transparent or translucent pieces of glass or plastic having curved and flat surfaces that cause light to converge/diverge or that cause little or no convergence/divergence.

Although shown as having two optical elements 180A-B, the eyewear device 100 can include other arrangements, such as a single optical element depending on the application or intended user of the eyewear device 100. As further shown, eyewear device 100 includes the left temple 110A adjacent the left lateral side 170A of the frame 105 and the right temple 110B adjacent the right lateral side 170B of the frame 105. The temples 110A-B may be integrated into the frame 105 on the respective sides 170A-B (as illustrated) or implemented as separate components attached to the frame 105 on the respective sides 170A-B. Alternatively, the temples 110A-B may be integrated into temples (not shown) attached to the frame 105.

In the example of FIG. 2A, the eye scanner 113 includes an infrared emitter 115 and an infrared camera 120. Visible light cameras typically include a blue light filter to block infrared light detection, in an example, the infrared camera 120 is a visible light camera, such as a low-resolution video graphic array (VGA) camera (e.g., 640×480 pixels for a total of 0.3 megapixels), with the blue filter removed. The infrared emitter 115 and the infrared camera 120 are co-located on the frame 105, for example, both are shown as connected to the upper portion of the left rim 107A. The frame 105 or one or more of the left and right temples 110A-B include a circuit board (not shown) that includes the infrared emitter 115 and the infrared camera 120. The infrared emitter 115 and the infrared camera 120 can be connected to the circuit board by soldering, for example.

Other arrangements of the infrared emitter 115 and infrared camera 120 can be implemented, including arrangements in which the infrared emitter 115 and infrared camera 120 are both on the right rim 107B, or in different locations on the frame 105, for example, the infrared emitter 115 is on the left rim 107A and the infrared camera 120 is on the right rim 107B. In another example, the infrared emitter 115 is on the frame 105 and the infrared camera 120 is on one of the temples 110A-B, or vice versa. The infrared emitter 115 can be connected essentially anywhere on the frame 105, left temple 110A, or right temple 110B to emit a pattern of infrared light. Similarly, the infrared camera 120 can be connected essentially anywhere on the frame 105, left temple 110A, or right temple 110B to capture at least one reflection variation in the emitted pattern of infrared light.

The infrared emitter 115 and infrared camera 120 are arranged to face inwards towards an eye of the user with a partial or full field of view of the eye in order to identify the respective eye position and gaze direction. For example, the infrared emitter 115 and infrared camera 120 are positioned directly in front of the eye, in the upper part of the frame 105 or in the temples 110A-B at either ends of the frame 105.

FIG. 2B is a rear view of an example hardware configuration of another eyewear device 200. In this example configuration, the eyewear device 200 is depicted as including an eye scanner 213 on a right temple 210B. As shown, an infrared emitter 215 and an infrared camera 220 are co-located on the right temple 210B. It should be understood that the eye scanner 213 or one or more components of the eye scanner 213 can be located on the left temple 210A and other locations of the eyewear device 200, for example, the frame 105. The infrared emitter 215 and infrared camera 220 are like that of FIG. 2A, but the eye scanner 213 can be varied to be sensitive to different light wavelengths as described previously in FIG. 2A.

Similar to FIG. 2A, the eyewear device 200 includes a frame 105 which includes a left rim 107A which is connected to a right rim 107B via a bridge 106; and the left and right rims 107A-B include respective apertures which hold the respective optical elements 180A-B comprising the see-through display 180C-D.

Figure 2C:
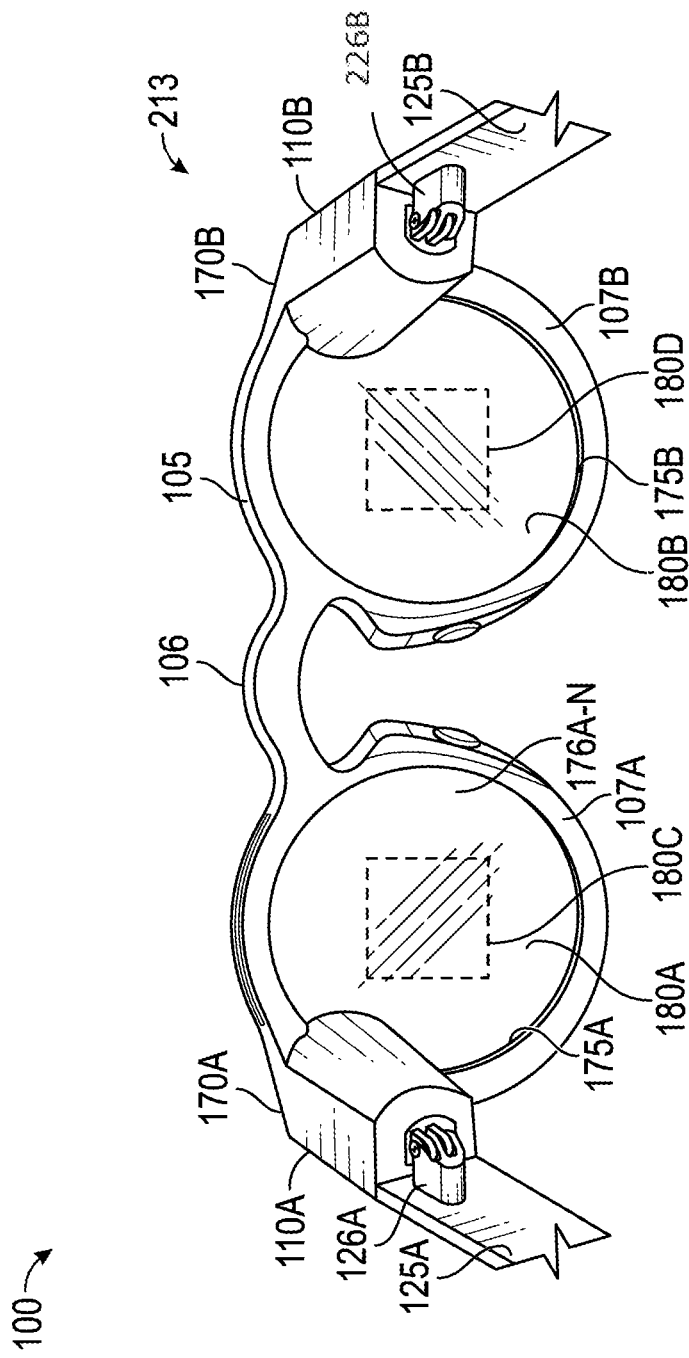
FIGS. 2C and 2D are rear views of example hardware configurations of the eyewear device, including two different types of image displays.
Figure 2D:
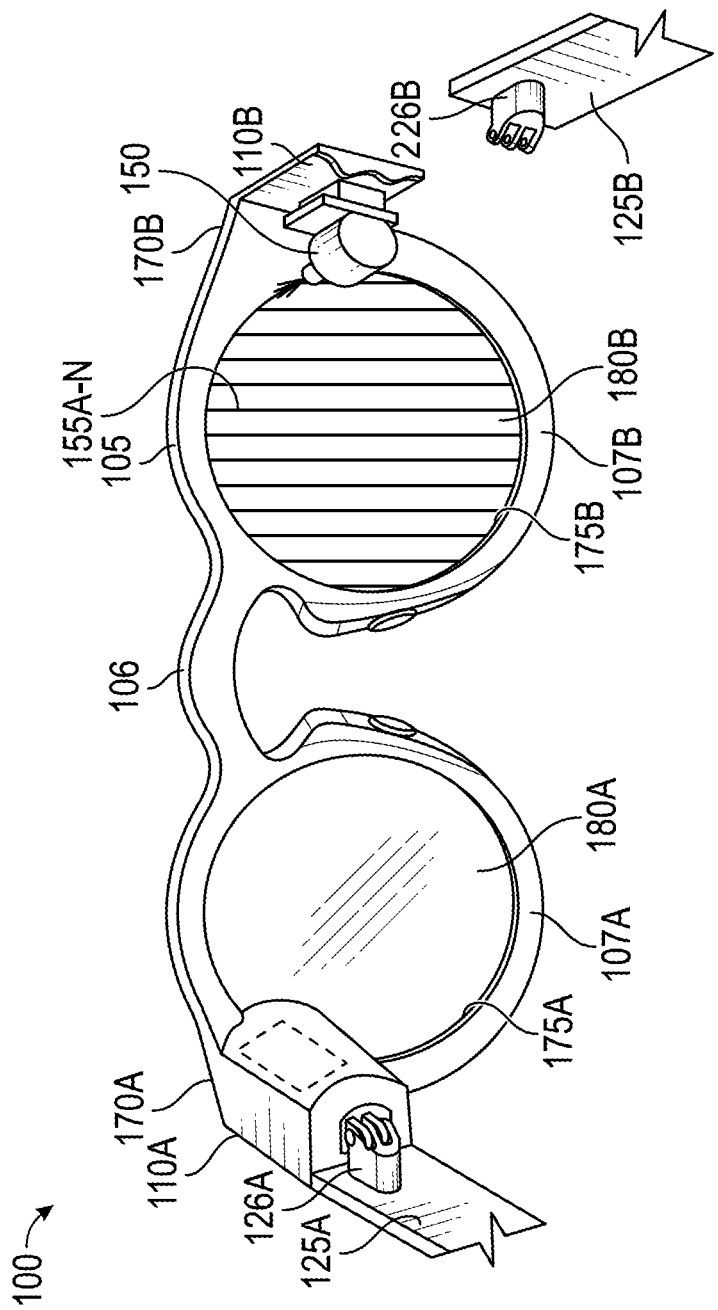

FIGS. 2C-D are rear views of example hardware configurations of the eyewear device 100, including two different types of see-through image displays 180C-D. In one example, these see-through image displays 180C-D of optical assembly 180A-B include an integrated image display. As shown in FIG. 2C, the optical assemblies 180A-B includes a suitable display matrix 180C-D of any suitable type, such as a liquid crystal display (LCD), an organic light-emitting diode (OLED) display, a waveguide display, or any other such display. The optical assembly 180A-B also includes an optical layer or layers 176, which can include lenses, optical coatings, prisms, mirrors, waveguides, optical strips, and other optical components in any combination. The optical layers 176A-N can include a prism having a suitable size and configuration and including a first surface for receiving light from display matrix and a second surface for emitting light to the eye of the user. The prism of the optical layers 176A-N extends over all or at least a portion of the respective apertures 175A-B formed in the left and right rims 107A-B to permit the user to see the second surface of the prism when the eye of the user is viewing through the corresponding left and right rims 107A-B. The first surface of the prism of the optical layers 176A-N faces upwardly from the frame 105 and the display matrix overlies the prism so that photons and light emitted by the display matrix impinge the first surface. The prism is sized and shaped so that the light is refracted within the prism and is directed towards the eye of the user by the second surface of the prism of the optical layers 176A-N. In this regard, the second surface of the prism of the optical layers 176A-N can be convex to direct the light towards the center of the eye. The prism can optionally be sized and shaped to magnify the image projected by the see-through image displays 180C-D, and the light travels through the prism so that the image viewed from the second surface is larger in one or more dimensions than the image emitted from the see-through image displays 180C-D.

In another example, the see-through image displays 180C-D of optical assembly 180A-B include a projection image display as shown in FIG. 2D. The optical assembly 180A-B includes a laser projector 150, which is a three-color laser projector using a scanning mirror or galvanometer. During operation, an optical source such as a laser projector 150 is disposed in or on one of the temples 125A-B of the eyewear device 100. Optical assembly 180A-B includes one or more optical strips 155A-N spaced apart across the width of the lens of the optical assembly 180A-B or across a depth of the lens between the front surface and the rear surface of the lens.

As the photons projected by the laser projector 150 travel across the lens of the optical assembly 180A-B, the photons encounter the optical strips 155A-N. When a particular photon encounters a particular optical strip, the photon is either redirected towards the user's eye, or it passes to the next optical strip. A combination of modulation of laser projector 150, and modulation of optical strips, may control specific photons or beams of light. In an example, a processor controls optical strips 155A-N by initiating mechanical, acoustic, or electromagnetic signals. Although shown as having two optical assemblies 180A-B, the eyewear device 100 can include other arrangements, such as a single or three optical assemblies, or the optical assembly 180A-B may have arranged different arrangement depending on the application or intended user of the eyewear device 100.

As further shown in FIGS. 2C-D, eyewear device 100 includes a left temple 110A adjacent the left lateral side 170A of the frame 105 and a right temple 110B adjacent the right lateral side 170B of the frame 105. The temples 110A-B may be integrated into the frame 105 on the respective lateral sides 170A-B (as illustrated) or implemented as separate components attached to the frame 105 on the respective sides 170A-B. Alternatively, the temples 110A-B may be integrated into temples 125A-B attached to the frame 105.

In one example, the see-through image displays include the first see-through image display 180C and the second see-through image display 180D. Eyewear device 100 includes first and second apertures 175A-B which hold the respective first and second optical assembly 180A-B. The first optical assembly 180A includes the first see-through image display 180C (e.g., a display matrix of FIG. 2C or optical strips 155A-N' and a projector 150A). The second optical assembly 180B includes the second see-through image display 180D e.g., a display matrix of FIG. 2C or optical strips 155A-N" and a projector 150B). The successive field of view of the successive displayed image includes an angle of view between about 15° to 30, and more specifically 24°, measured horizontally, vertically, or diagonally. The successive displayed image having the successive field of view represents a combined three-dimensional observable area visible through stitching together of two displayed images presented on the first and second image displays.

As used herein, "an angle of view" describes the angular extent of the field of view associated with the displayed images presented on each of the left and right image displays 180C-D of optical assembly 180A-B. The "angle of coverage" describes the angle range that a lens of visible light cameras 114A-B or infrared camera 220 can image. Typically, the image circle produced by a lens is large enough to cover the film or sensor completely, possibly including some vignetting (i.e., a reduction of an image's brightness or saturation toward the periphery compared to the image center). If the angle of coverage of the lens does not fill the sensor, the image circle will be visible, typically with strong vignetting toward the edge, and the effective angle of view will be limited to the angle of coverage. The "field of view" is intended to describe the field of observable area which the user of the eyewear device 100 can see through his or her eyes via the displayed images presented on the left and right image displays 180C-D of the optical assembly 180A-B. Image display 180C of optical assembly 180A-B can have a field of view with an angle of coverage between 15° to 30°, for example 24°, and have a resolution of 480×480 pixels.

Figure 3:
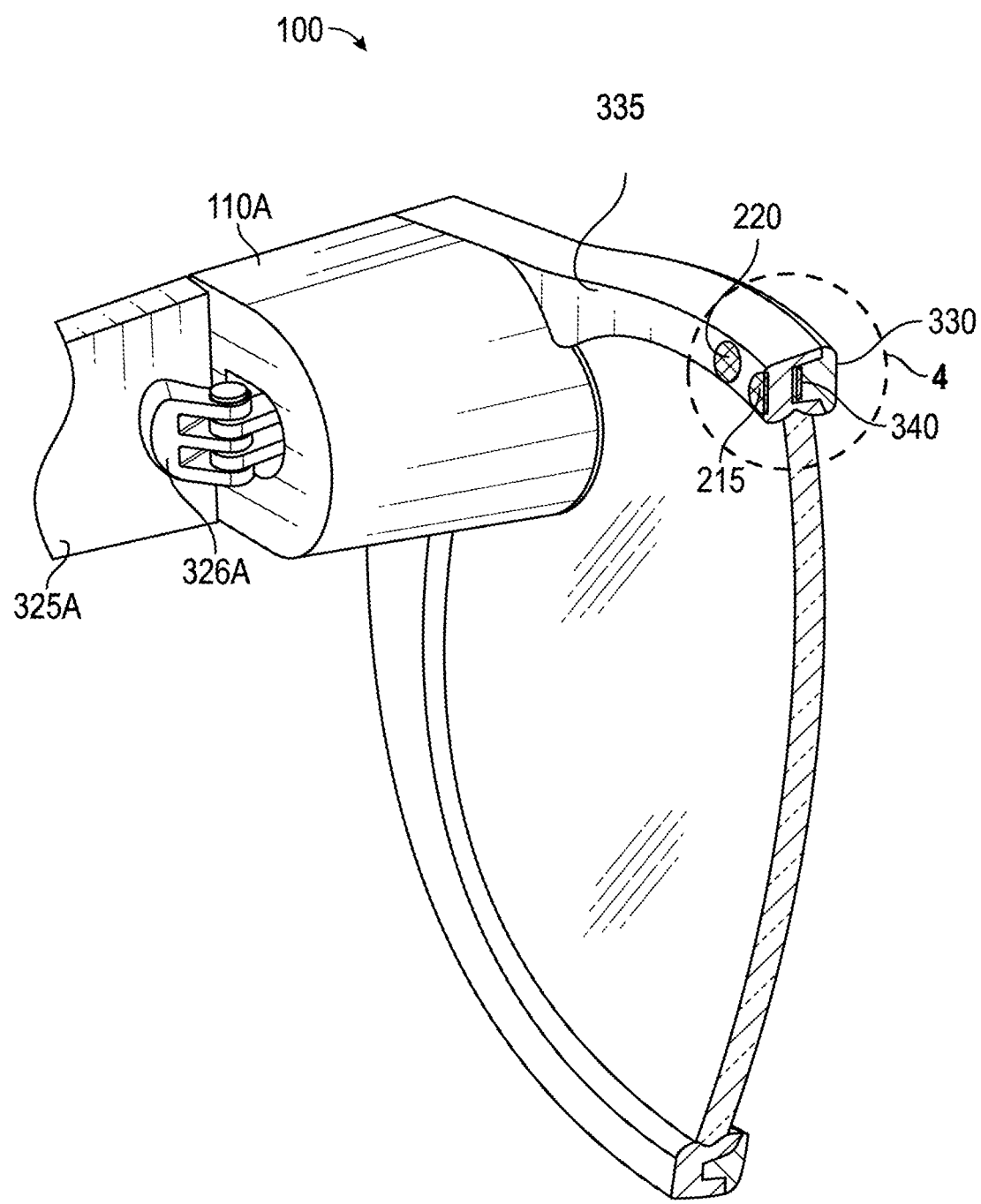
FIG. 3 shows a rear perspective view of the eyewear device of FIG. 2A depicting an infrared emitter, an infrared camera, a frame front, a frame back, and a circuit board.

FIG. 3 shows a rear perspective view of the eyewear device of FIG. 2A. The eyewear device 100 includes an infrared emitter 215, infrared camera 220, a frame front 330, a frame back 335, and a circuit board 340. It can be seen in FIG. 3 that the upper portion of the left rim of the frame of the eyewear device 100 includes the frame front 330 and the frame back 335. An opening for the infrared emitter 215 is formed on the frame back 335.

As shown in the encircled cross-section 4 in the upper middle portion of the left rim of the frame, a circuit board, which is a flexible PCB 340, is sandwiched between the frame front 330 and the frame back 335. Also shown in further detail is the attachment of the left temple 110A to the left temple 325A via the left hinge 326A. In some examples, components of the eye movement tracker 213, including the infrared emitter 215, the flexible PCB 340, or other electrical connectors or contacts may be located on the left temple 325A or the left hinge 326A.

Figure 4:
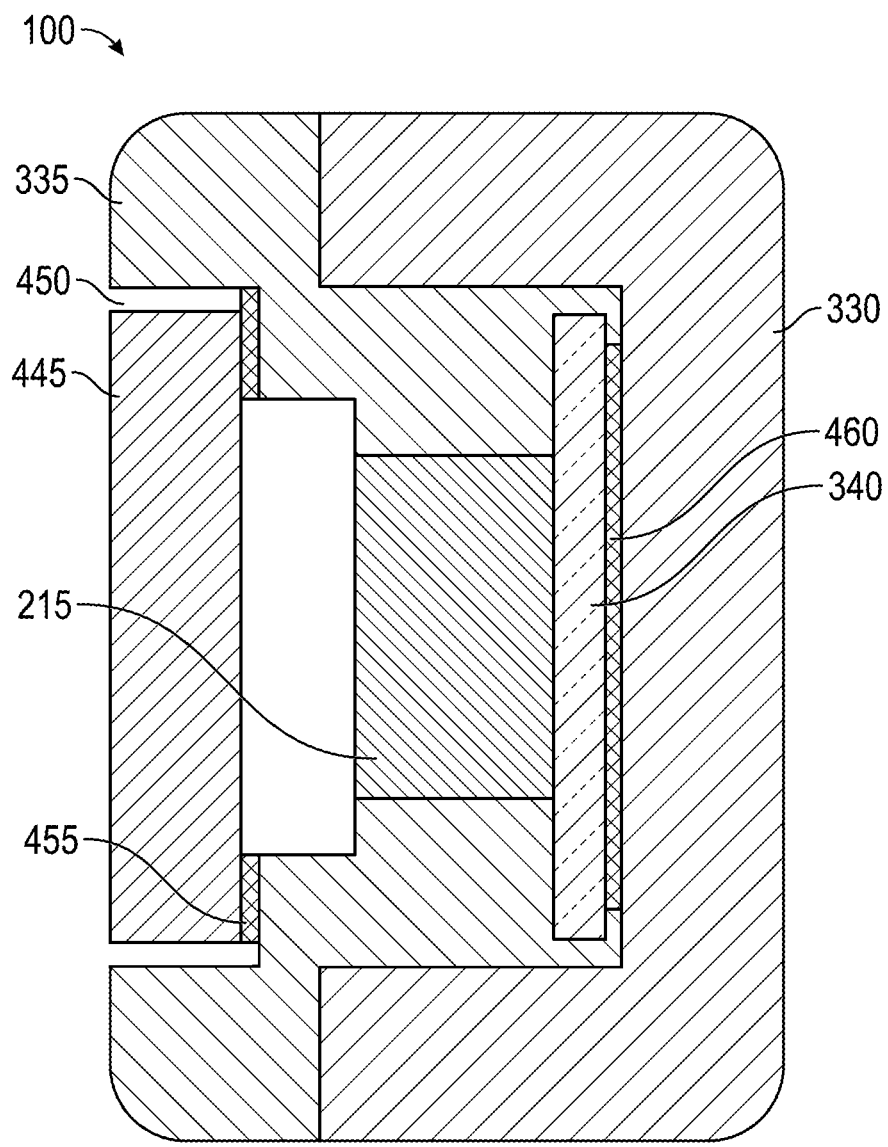
FIG. 4 is a cross-sectional view taken through the infrared emitter and the frame of the eyewear device of FIG. 3.

FIG. 4 is a cross-sectional view through the infrared emitter 215 and the frame corresponding to the encircled cross-section 4 of the eyewear device of FIG. 3. Multiple layers of the eyewear device 100 are illustrated in the cross-section of FIG. 4, as shown the frame includes the frame front 330 and the frame back 335. The flexible PCB 340 is disposed on the frame front 330 and connected to the frame back 335. The infrared emitter 215 is disposed on the flexible PCB 340 and covered by an infrared emitter cover lens 445. For example, the infrared emitter 215 is reflowed to the back of the flexible PCB 340. Reflowing attaches the infrared emitter 215 to contact pad(s) formed on the back of the flexible PCB 340 by subjecting the flexible PCB 340 to controlled heat which melts a solder paste to connect the two components. In one example, reflowing is used to surface mount the infrared emitter 215 on the flexible PCB 340 and electrically connect the two components. However, it should be understood that through-holes can be used to connect leads from the infrared emitter 215 to the flexible PCB 340 via interconnects, for example.

The frame back 335 includes an infrared emitter opening 450 for the infrared emitter cover lens 445. The infrared emitter opening 450 is formed on a rear-facing side of the frame back 335 that is configured to face inwards towards the eye of the user. In the example, the flexible PCB 340 can be connected to the frame front 330 via the flexible PCB adhesive 460. The infrared emitter cover lens 445 can be connected to the frame back 335 via infrared emitter cover lens adhesive 455. The coupling can also be indirect via intervening components.

Figure 5:
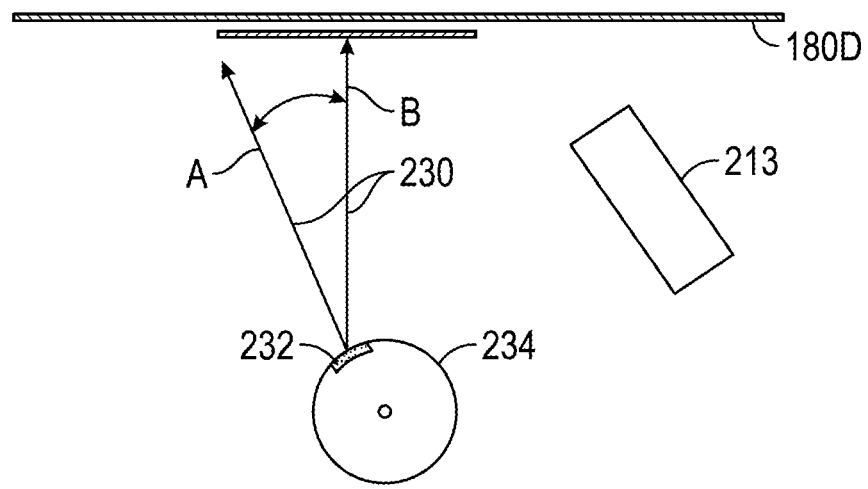
FIG. 5 illustrates detecting eye gaze direction.
Figure 6:
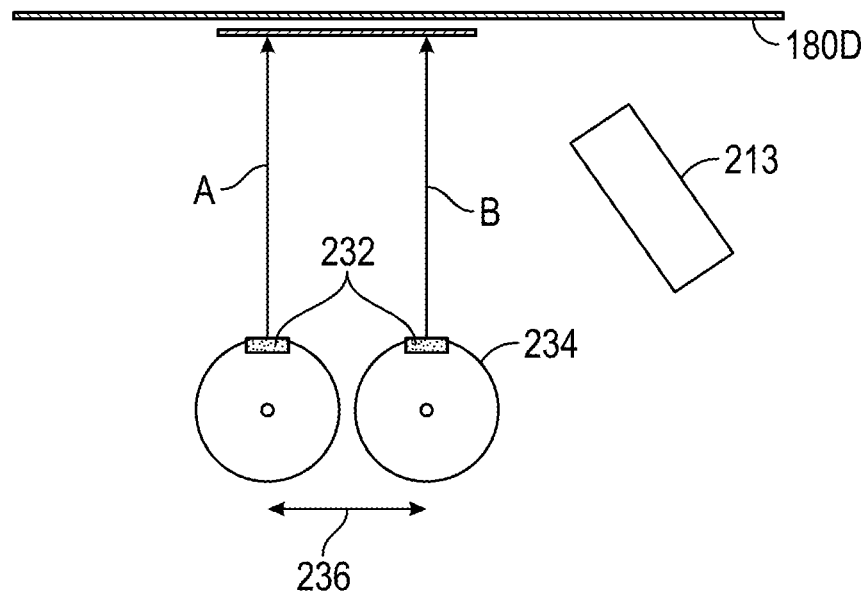
FIG. 6 illustrates detecting eye position.

In an example, the processor 932 utilizes eye tracker 213 to determine an eye gaze direction 230 of a wearer's eye 234 as shown in FIG. 5, and an eye position 236 of the wearer's eye 234 within an eyebox as shown in FIG. 6. The eye tracker 213 is a scanner which uses infrared light illumination (e.g., near-infrared, short-wavelength infrared, mid-wavelength infrared, long-wavelength infrared, or far infrared) to captured image of reflection variations of infrared light from the eye 234 to determine the gaze direction 230 of a pupil 232 of the eye 234, and also the eye position 236 with respect to the see-through display 180D.

Figure 7:
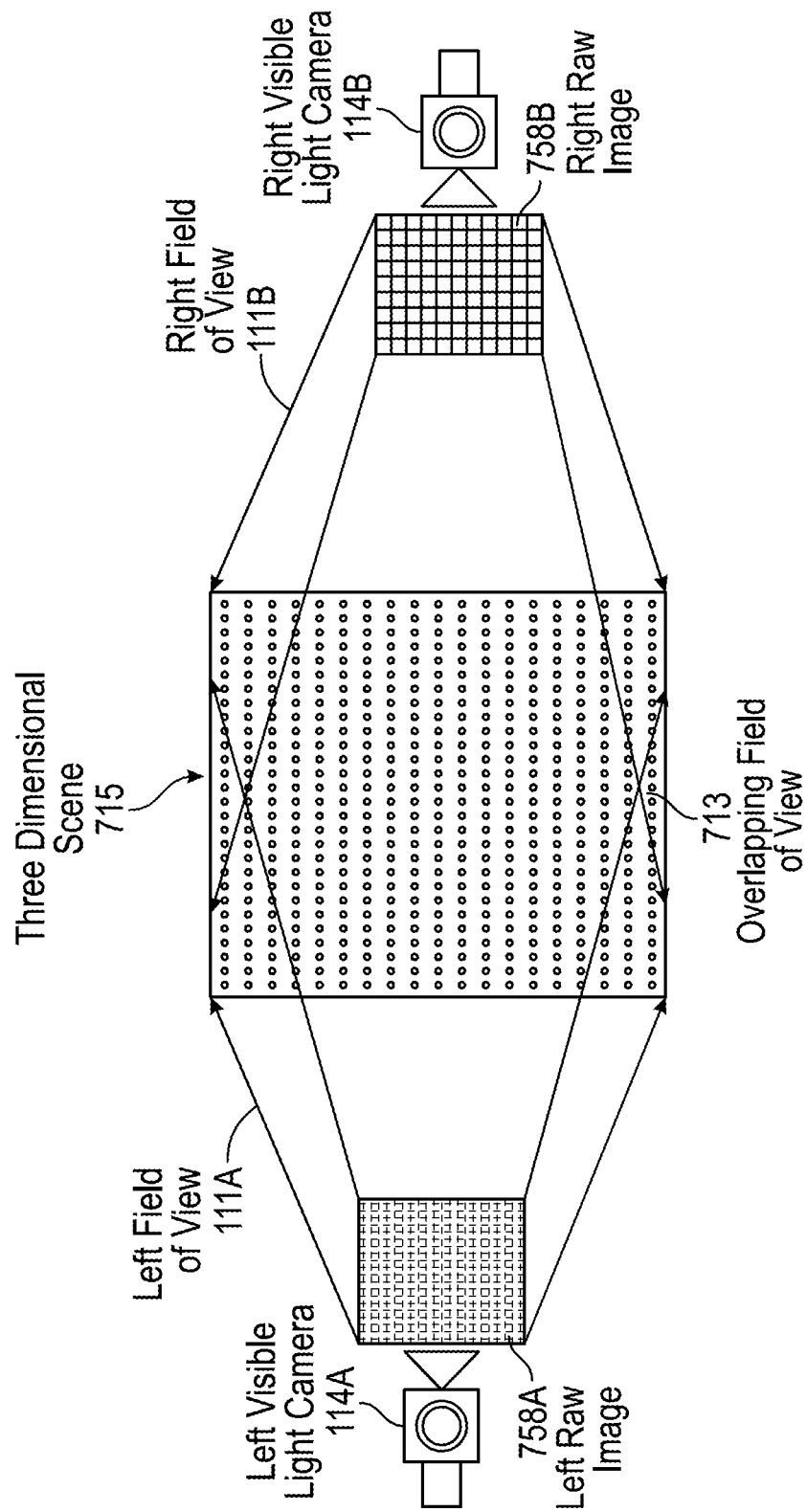
FIG. 7 depicts an example of visible light captured by the left visible light camera as a left raw image and visible light captured by the right visible light camera as a right raw image.

FIG. 7 depicts an example of capturing visible light with cameras. Visible light is captured by the left visible light camera 114A with a left visible light camera field of view 111A as a left raw image 758A. Visible light is captured by the right visible light camera 114B with a right visible light camera field of view 111B as a right raw image 758B having an overlap 712 with the left visible light camera field of view 111A. Based on processing of the left raw image 758A and the right raw image 758B, a three-dimensional depth map 715 of a three-dimensional scene, referred to hereafter as an image, is generated by processor 932.

Figure 8C:
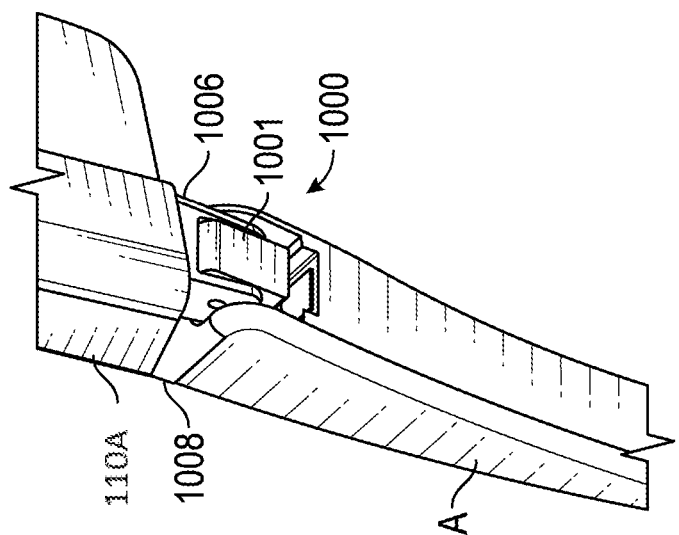
FIG. 8C illustrates a rear perspective view of the hyperextended hinge assembly.
Figure 8B:
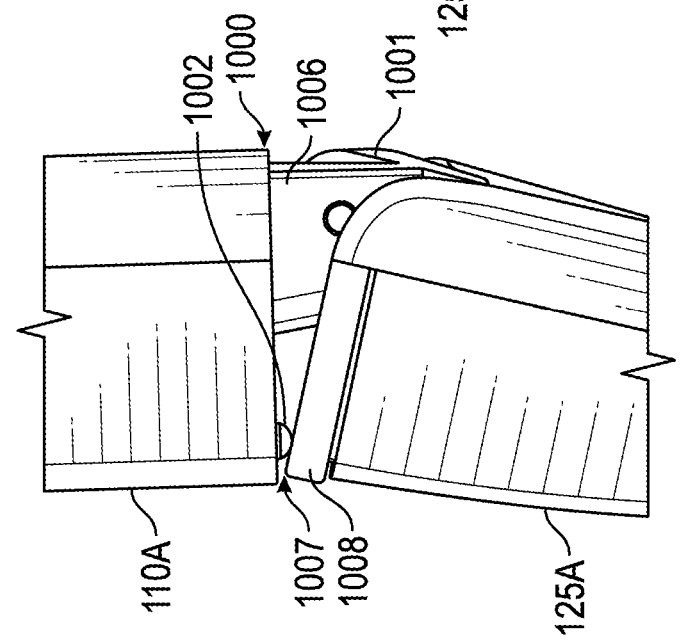
FIG. 8B is a top view of the hinge assembly in the hyperextended position.
Figure 8A:
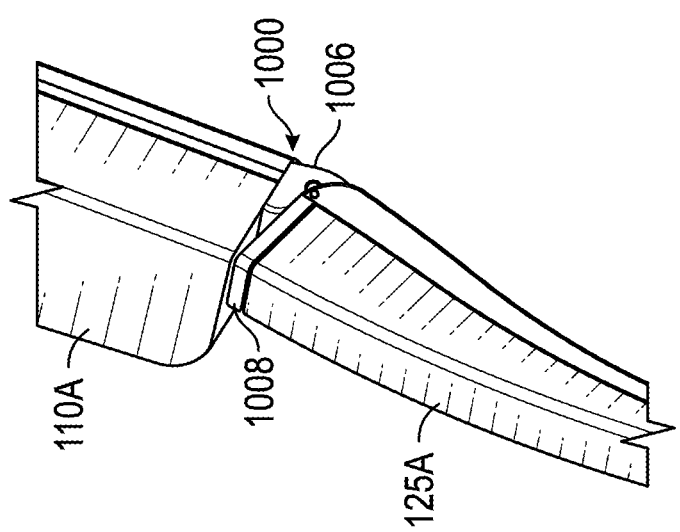
FIG. 8A illustrates a perspective view of an example hyperextendable eyewear hinge assembly.
Figure 11:
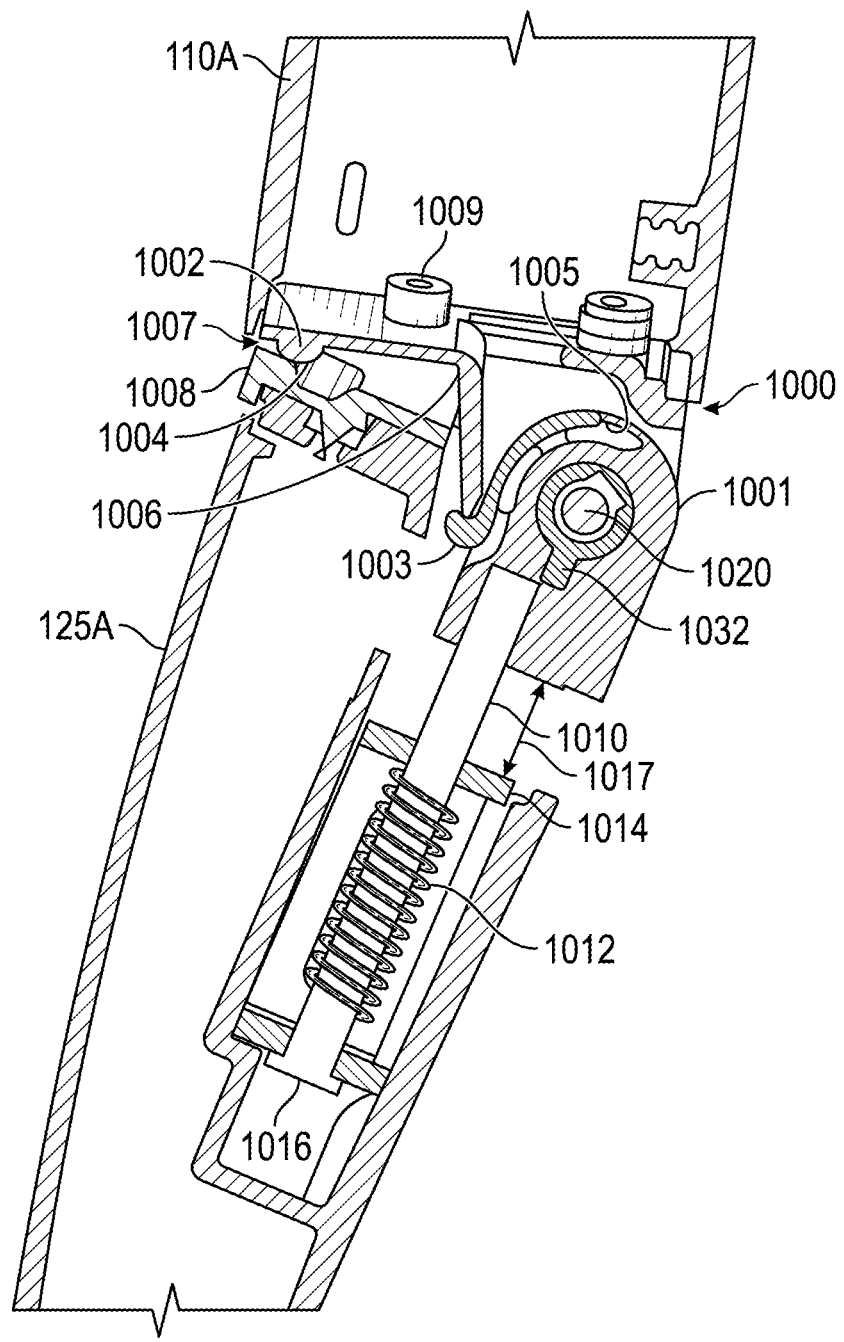
FIG. 11 illustrates a top perspective view of the left temple in the hyperextended position, illustrating the bushing sliding along the pin.

FIG. 8A illustrates a perspective view of an example hyperextendable eyewear hinge assembly 1000 comprising a hinge 1001 rotatably secured in a cap hinge 1006 and configured to allow rotation of the left temple 125A with respect to fixed left temple 110A. The left temple 110A can form a portion of the frame 105 as shown, and the left temple 110A can also be regarded as a frame extension. The cap hinge 1006 is secured to the distal end of the left temple 110A by a screw boss 1009 as shown in FIG. 11. An elongated pin 1010 is secured to, and radially extends from, hinge 1001. The elongated pin 1010 is dual purpose and is configured to allow hyperextended outward rotation of left temple 125A with respect to left temple 110A, as shown in FIG. 8A, FIG. 8B, and FIG. 8C. The elongated pin 1010 is also configured to allow linear extension of the left temple 125A along the elongated pin 1010 and in an axial direction from the hinge 1001. This hinge assembly 1000 can also be provided between right temple 110B and right temple 125B.

Figure 12:
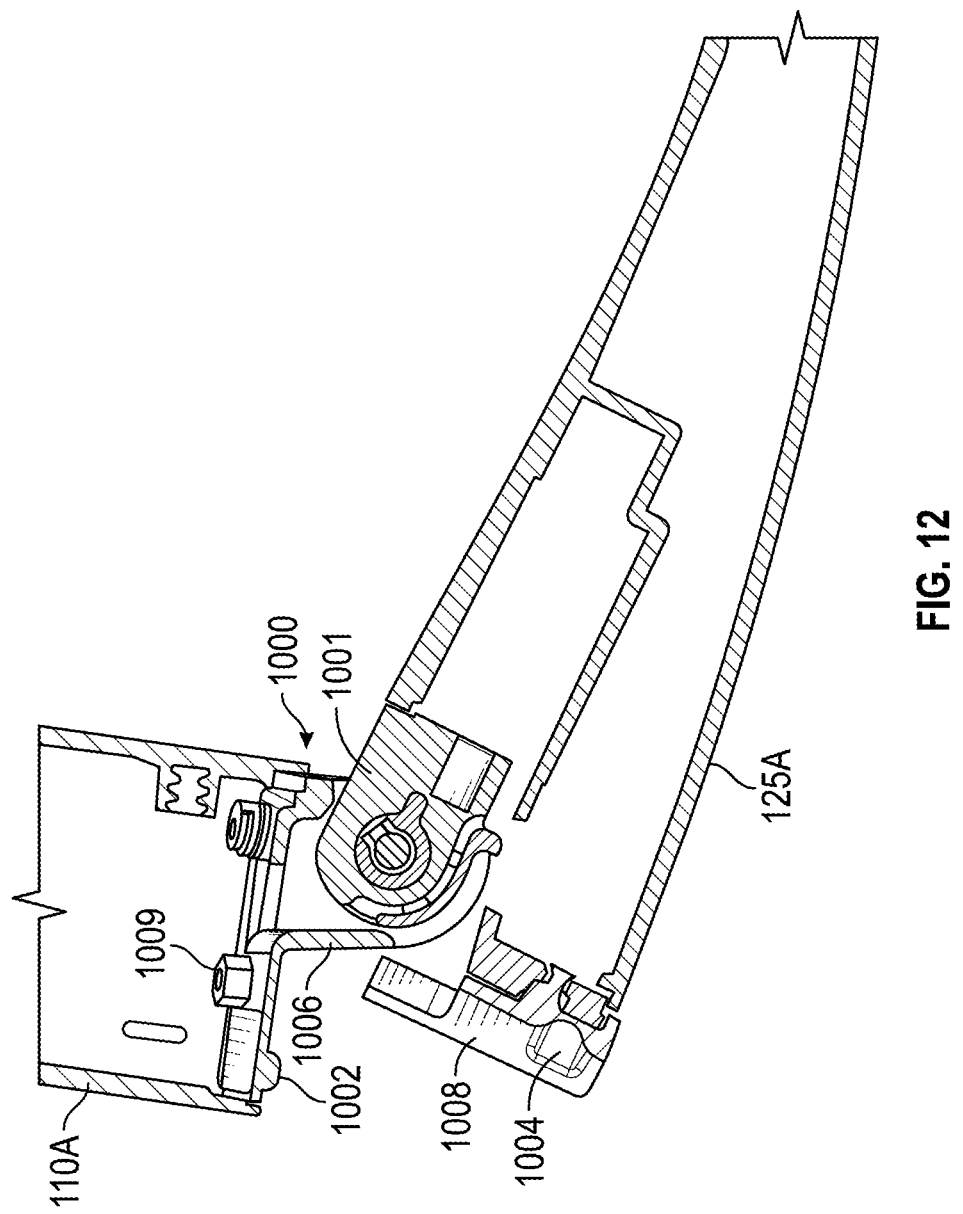
FIG. 12 illustrates the left temple closed with respect to the left temple and illustrates the protrusion and the recess defined in the cap hinge.

FIG. 8B is a top view of the hinge assembly 1000 in the hyperextended position. An outwardly extending protrusion 1002 is positioned on a flange of the cap hinge 1006, and the protrusion 1002 faces a recess 1004 formed in a cosmetic trim 1008 that is secured to a proximal end of left temple 125A. The protrusion 1002 extends laterally and functions as a cam when the left temple 125A is hyperextended such that the protrusion 1002 leverages off the cosmetic trim 1008 and create a gap 1007 between the sharp corner edges of the temples which would otherwise wear, as also shown in FIG. 12

FIG. 8C illustrates a rear perspective view of the hyperextended hinge assembly 1000. As shown, the hinge 1001 is positioned in the cap hinge 1006. The feature will be further discussed in reference to FIG. 14A-C.

Figure 9A:
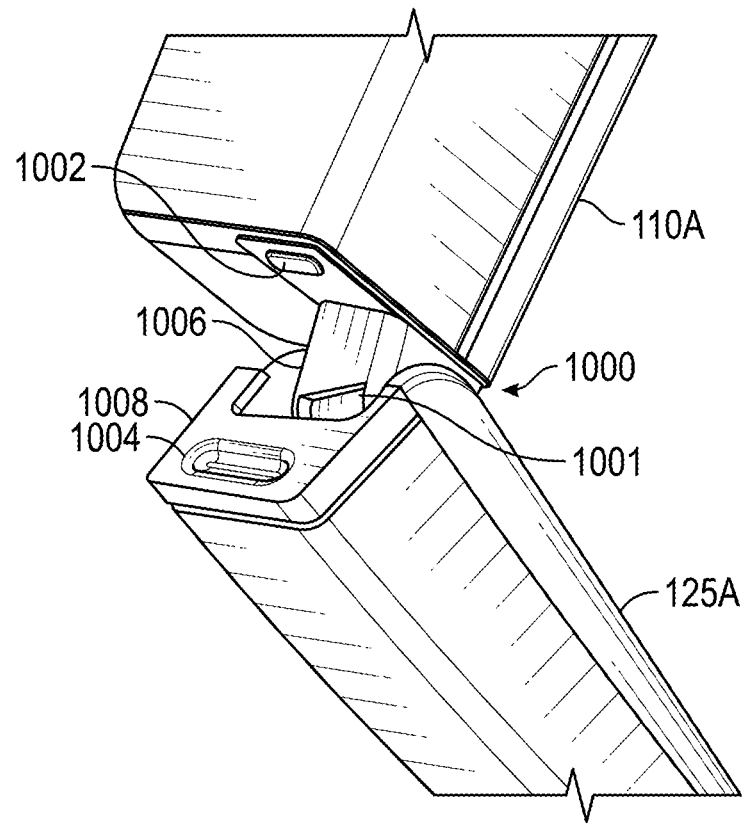
FIG. 9A illustrates a top perspective view of the left temple folded inwardly from fixed left temple.

FIG. 9A illustrates a top perspective view of the left temple 125A folded inwardly from fixed left temple 110A. The proximal end of the cosmetic trim 1008 facing the cap hinge 1006 includes the elongated recess 1004. The recess 1004 is commensurate in shape and size with the protrusion 1002, and which receives the protrusion 1002 when the left temple 125 is in the open (not hyperextended) position. As the hinge 1001 is rotated outwardly from the open position to the hyperextended position as shown in FIG. 8B, the protrusion 1002 laterally slides out of the recess 1004 and functions as the cam to create leverage and to create gap 1007 as previously discussed. In another example, the protrusion 1002 and recess 1004 can have other shapes, such as a simple round protrusion forming a dimple, and a round recess, and limitation to the particular shape of each is not to be inferred. The elongated protrusion 1002 and elongated recess 1004 are preferred shapes as they better align the left temple 125A to the left temple 110A to securely rotate outwardly, such as at a 90-degree angle.

Figure 9B:
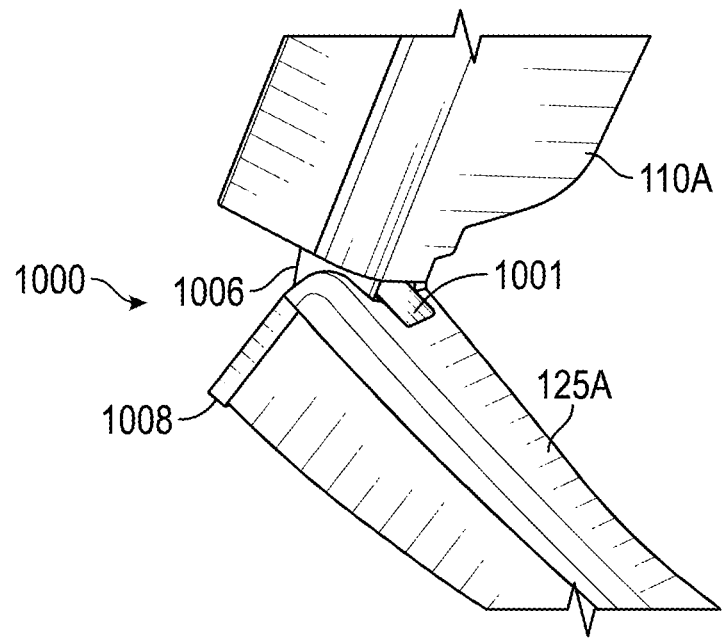
FIG. 9B illustrates a bottom perspective view of the left temple folded closed with respect to the fixed left temple.

FIG. 9B illustrates a bottom perspective view of the left temple 125A folded closed with respect to the fixed left temple 110A. It is noted a flexible printed circuit (FPC) is encased in the hinge 1001 and not viewable, as will be discussed further shortly.

Figure 10:
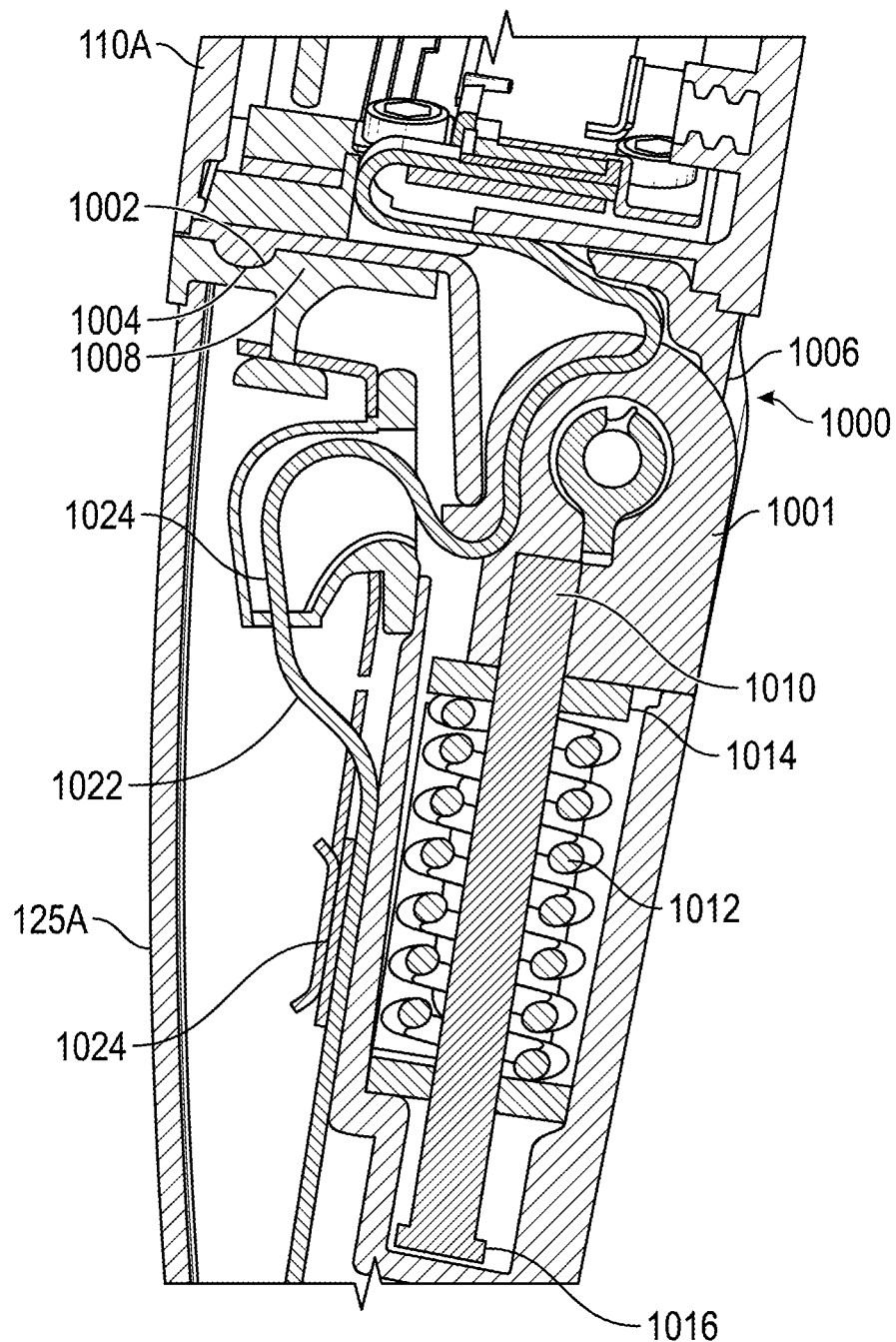
FIG. 10 illustrates a top sectional view of the left temple in the open position with respect to the left temple.

FIG. 10 illustrates a top sectional view of the left temple 125A in the open position with respect to the left temple 110A. As shown, the protrusion 1002 is seated in the recess 1004. FIG. 10 illustrates the elongated pin 1010 securely coupled to the hinge 1001 at a proximal end and extending longitudinally within the left temple 125A. The pin 1010 is positioned within and encompassed by a spring 1012, which spring 1012 is secured within a rectangular bushing 1014. The sliding pin has a shoulder 1016 at the distal end which is positioned outside the bushing 1014. The shoulder 1016 limits the travel of the bushing 1014 along the sliding pin 1010 when the left temple 125A is fully hyperextended, as shown in FIG. 11. A FPC 1022 is shown extending within the left temple 125A and under a guide member 1024 and has a pair of strain relief loops to assist in hyperextending, and closing the left temple 125A as will be discussed shortly.

FIG. 11 illustrates a top perspective view of the left temple 125A in the hyperextended position, illustrating the bushing 1014 sliding along the pin 1010 and extending to the distal end of the pin 1010 and engaging the shoulder 1016 which limits travel of the bushing 1014. This creates a gap 1017 between the hinge 1001 and the bushing 1014. In this position, the spring 1012 is fully compressed which creates a slight bias force to help the left temple 125A to compress against a user's head in comfort and keep the eyewear on the user. The hinge 1001 has a flange 1003 having a narrowed web 1005 that is configured to function as a soft radius for the FPC 1022 to bend around. While flange 1003 can be designed to provide a rotation hardstop, the hardstop functionality for hyperextension of the temple is provided by the shoulder 1016 on the pin 1010. A fastener 1020 is positioned in a friction clip 1032 and extends within the hinge 1001 to secure left temple 125A to left temple 110A.

FIG. 12 illustrates the left temple 125A closed with respect to the left temple 110A and illustrates the protrusion 1002 and the recess 1004 defined in the cap hinge 1006 as previously described.

Figure 13A:
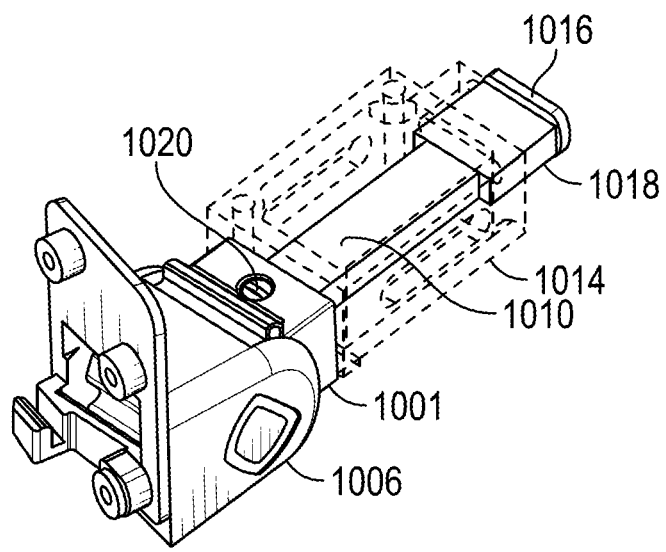
FIG. 13A is a top perspective view of pin positioned within the bushing.
Figure 13B:
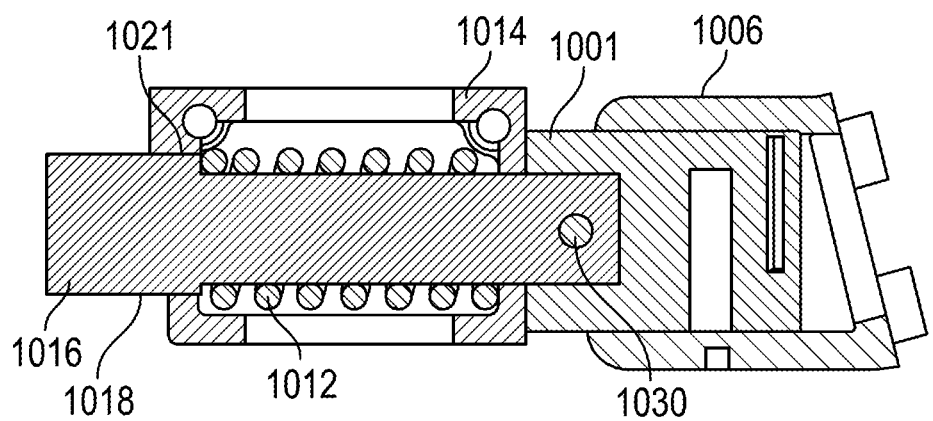
FIG. 13B illustrates the pin shoulder at the distal end that securely extends through an opening in the distal end of the bushing.

FIG. 13A is a top perspective view of pin 1010 positioned within the bushing 1014. The pin 1010 has a rectangular shoulder 1018 at the distal end that securely extends through an opening 1021 in the distal end of the bushing 1014 as shown in FIG. 13B. The shoulder 1018 has the same size and shape of the bushing opening 1021. The shoulder 1018 engages the distal end of the spring 1012 to retain and compress the spring 1012 within the bushing 1014 in the hyperextended position. The shoulder 1018 also functions to reduce the amount of rotation of the shaft on its center axis. By making shoulder 1018 wider than the rest of the pin 1010, the shoulder 1018 contacts the bushing 1014 at a smaller angle. A fastener 1030 secures the proximal end of the pin 1010 to the hinge 1001. The hinge 1001 is rotatably positioned in the cap hinge 1006.

Figure 13C:
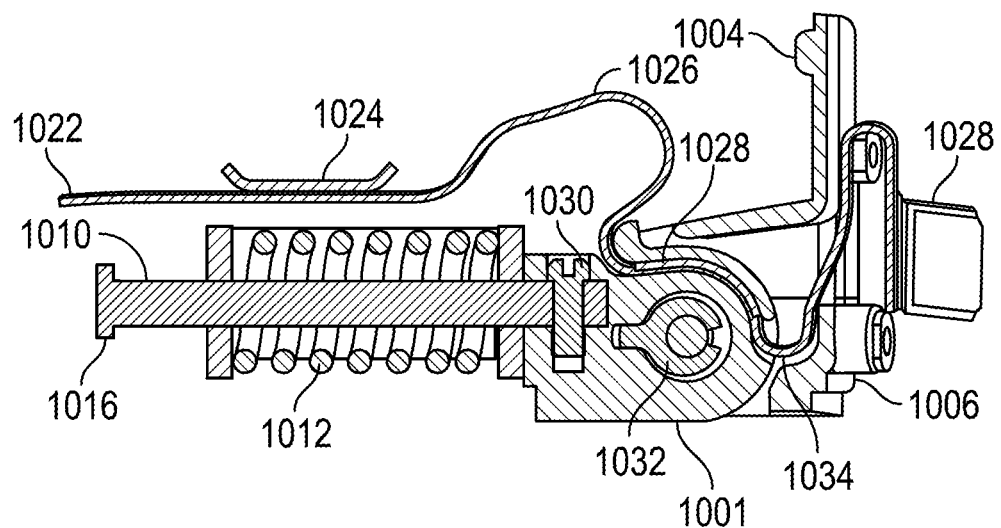
FIG. 13C illustrates a side sectional view illustrating the FPC extending within the left hinge.

FIG. 13C illustrates a side sectional view illustrating the FPC 1022 extending within the left temple 125A, as previously described with respect to FIG. 10. The left temple 125A has the guide member 1024 (FIG. 10) forming a first channel 1027 receiving the FPC 1022 and forming a first service loop 1026 for FPC 1022. The first service loop 1026 forms a strain relief that straightens out the FPC 1022 when the bushing 1014 slides outwardly in the hyperextended position, as discussed with respect to FIG. 11. The hinge 1001 has a second channel 1028 formed therein receiving the FPC 1022 and forming a second service loop 1034 for when the hinge rotates from the closed position to the open position and the hyperextended position and the bushing 1014 extends along pin 1010. The first service loop 1026 and the second service loop 1034 are spaced apart from each other by the hinge 1001, and they are positioned on opposite sides of the second channel 1028.

Figure 13D:
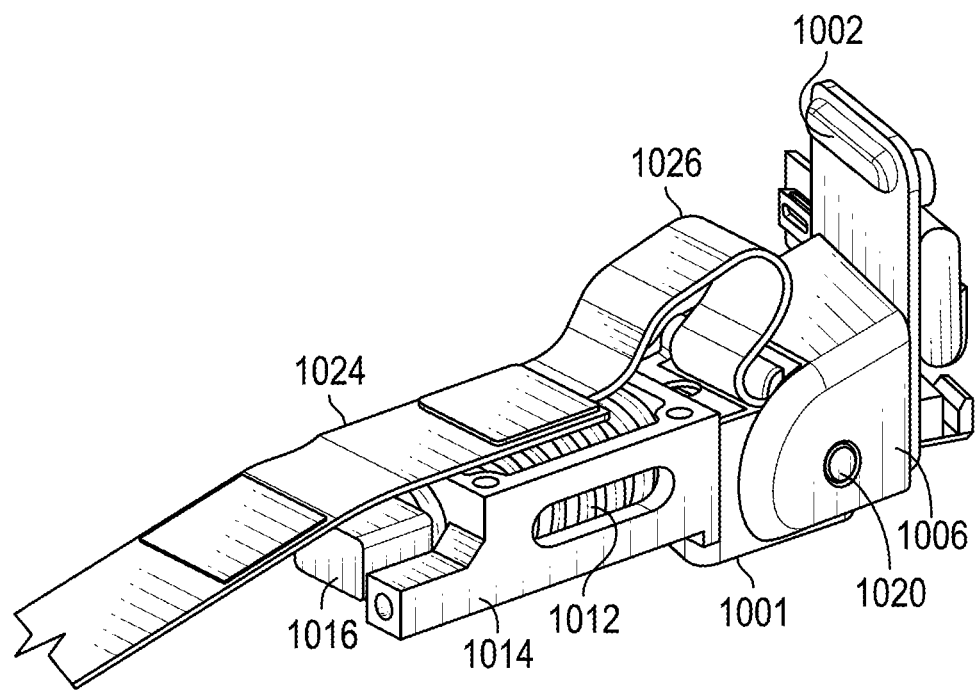
FIG. 13D illustrates the first service loop formed over the bushing when first temple is in the closed position.

FIG. 13D illustrates the first service loop 1026 formed over the bushing 1014 when first temple 125A is in the closed position. This first service loop 1026 straightens out when the bushing 1014 extends along the length of the pin 1010, and the FPC 1022 slides within the first channel 1027.

Figure 13E:
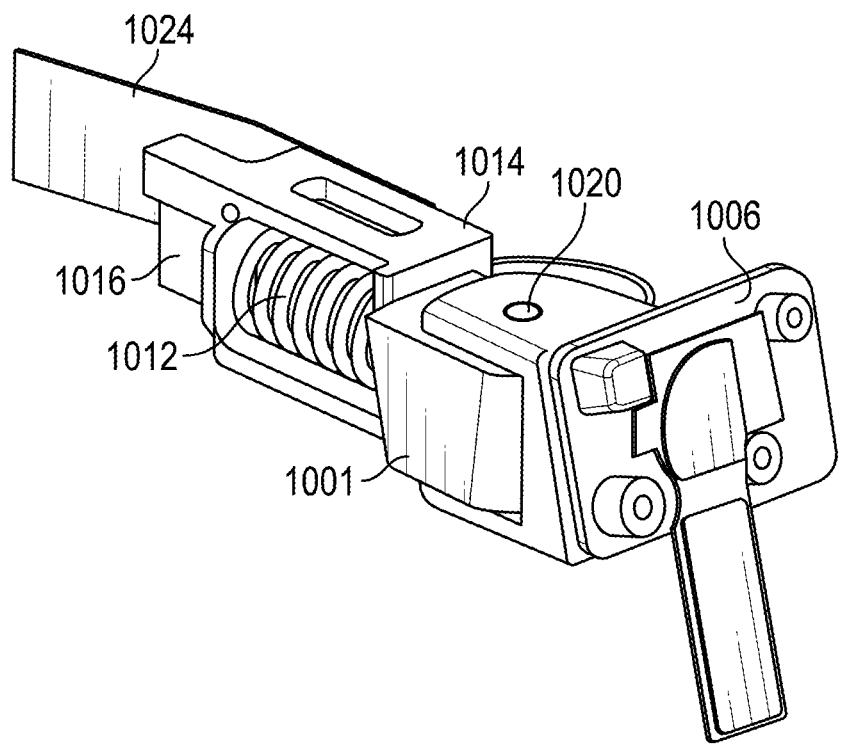
FIG. 13E illustrates the hinge retracted against the bushing with the spring pushing on the shoulder to provide the retraction force.

FIG. 13E illustrates the hinge 1001 retracted against the bushing 1014 with the spring 1012 pushing on the shoulder 1016 to provide the retraction force.

Figure 14A:
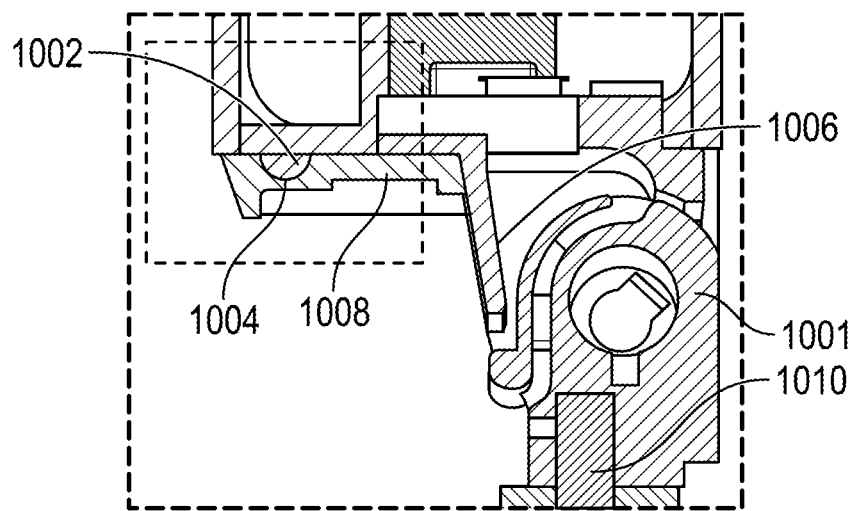
FIG. 14A illustrates the left temple in the open position, wherein the protrusion is seated in the recess.
Figure 14B:
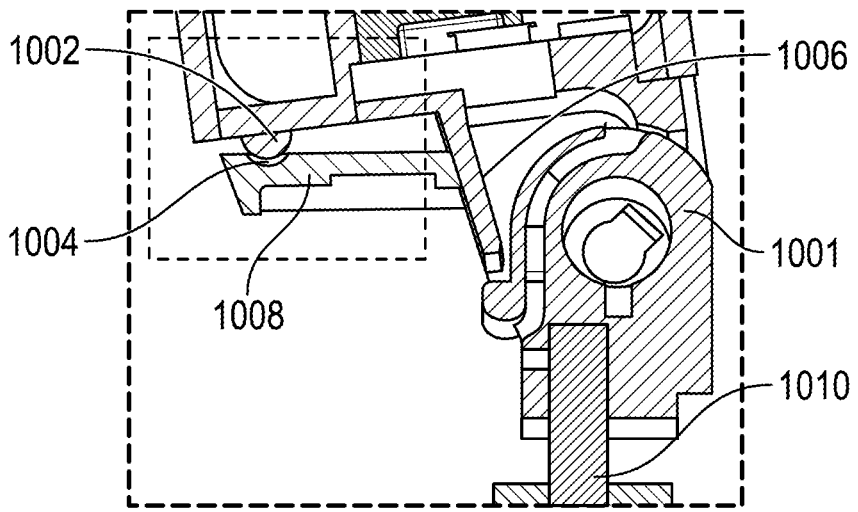
FIG. 14B illustrates the hinge beginning to be hyperextended, the protrusion sliding along the edge of the recess and being partially withdrawn from the recess and forming the cam and gap.
Figure 14C:
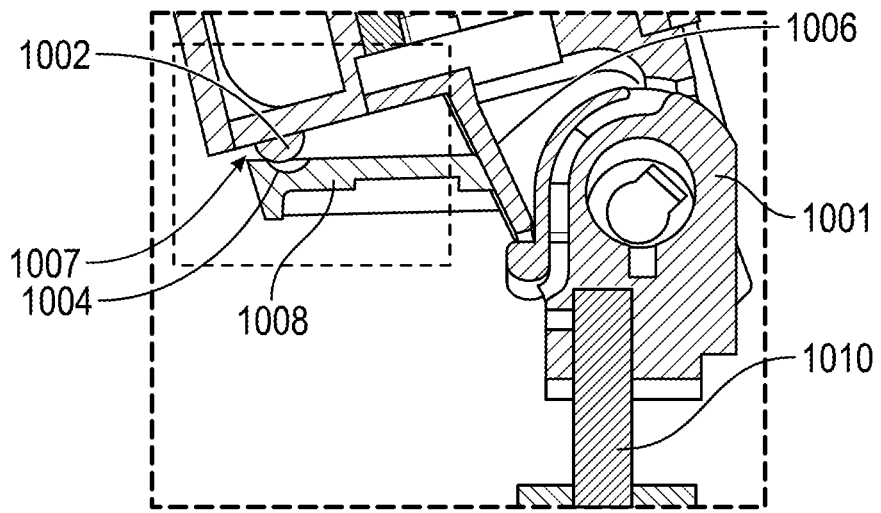
FIG. 14C illustrates the hinge fully hyperextended.

Referring to FIG. 14A, FIG. 14B, and FIG. 14C, there is shown the progression of the protrusion 1002 sliding out the recess 1004 of cap hinge 1006 and forming a cam as the hinge 1001 is hyperextended, as previously described with respect to FIG. 8B.

FIG. 14A illustrates the left temple 125A in the open position, wherein the protrusion 1002 is seated in the recess 1004. As the hinge 1000 begins to be hyperextended, as shown in FIG. 14B, the protrusion 1002 slides along the edge of the recess 1004 and becomes partially withdrawn from the recess 1004 and forms the cam, and gap 1007. The bushing 1014 is partially slid along the pin 1010. As shown in FIG. 14C, the hinge 1000 is fully hyperextended, and the protrusion 1002 is fully withdrawn from the recess 1004. Here, the bushing 1014 is fully extended along the pin 1010 and engages against the shoulder 1018, as shown in FIG. 11. The protrusion 1002 and the recess 1004 are both elongated to guide the left temple 125A to the hyperextended position in a predetermined direction, such as 110 degrees with respect to the left temple 110A.

Figure 15:
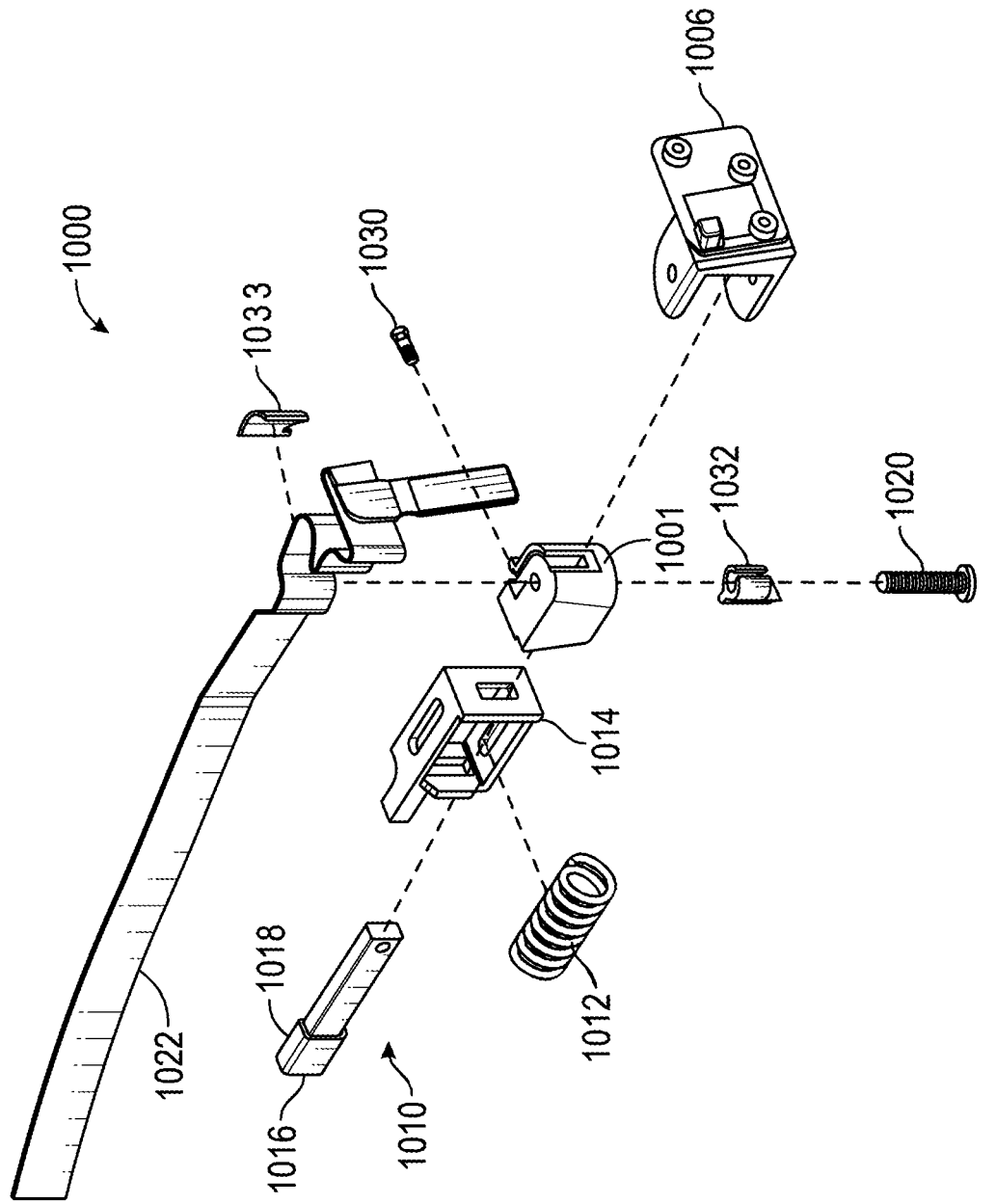
FIG. 15 illustrates an exploded view of the parts shown assembled in the previous views.

FIG. 15 illustrates an exploded view of the parts shown assembled in the previous views. A piece of foam tape 1033 may be used to help hold the FPC 1022 inside the hinge 1000, and it is optional.

Figure 16:
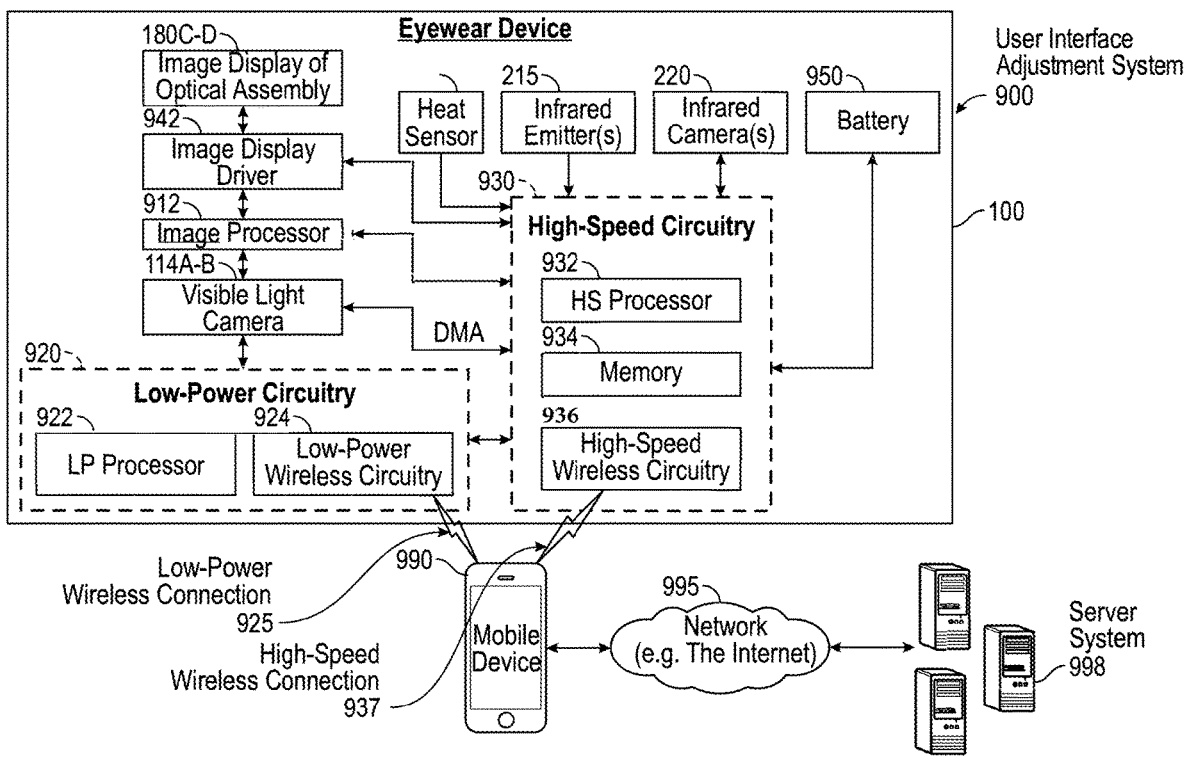
FIG. 16 illustrates a block diagram of electronic components of the eyewear device.

FIG. 16 depicts a high-level functional block diagram including example electronic components disposed in eyewear 100 and 200. The illustrated electronic components include the processor 932, the memory 934, and the see-through image display 180C and 180D.

Memory 934 includes instructions for execution by processor 932 to implement functionality of eyewear 100/200, including instructions for processor 932 to control in the image 715. Processor 932 receives power from battery 950 and executes the instructions stored in memory 934, or integrated with the processor 932 on-chip, to perform functionality of eyewear 100/200, and communicating with external devices via wireless connections.

A user interface adjustment system 900 includes a wearable device, which is the eyewear device 100 with an eye movement tracker 213 (e.g., shown as infrared emitter 215 and infrared camera 220 in FIG. 2B). User interface adjustments system 900 also includes a mobile device 990 and a server system 998 connected via various networks. Mobile device 990 may be a smartphone, tablet, laptop computer, access point, or any other such device capable of connecting with eyewear device 100 using both a low-power wireless connection 925 and a high-speed wireless connection 937. Mobile device 990 is connected to server system 998 and network 995. The network 995 may include any combination of wired and wireless connections.

Eyewear device 100 includes at least two visible light cameras 114A-B (one associated with the left lateral side 170A and one associated with the right lateral side 170B). Eyewear device 100 further includes two see-through image displays 180C-D of the optical assembly 180A-B (one associated with the left lateral side 170A and one associated with the right lateral side 170B). Eyewear device 100 also includes image display driver 942, image processor 912, low-power circuitry 920, and high-speed circuitry 930. The components shown in FIG. 9 for the eyewear device 100 are located on one or more circuit boards, for example a PCB or flexible PCB, in the temples. Alternatively, or additionally, the depicted components can be located in the temples, frames, hinges, or bridge of the eyewear device 100. Left and right visible light cameras 114A-B can include digital camera elements such as a complementary metal-oxide-semiconductor (CMOS) image sensor, charge coupled device, a lens, or any other respective visible or light capturing elements that may be used to capture data, including images of scenes with unknown objects.

Eye movement tracking programming 945 implements the user interface field of view adjustment instructions, including, to cause the eyewear device 100 to track, via the eye movement tracker 213, the eye movement of the eye of the user of the eyewear device 100. Other implemented instructions (functions) cause the eyewear device 100 to determine, a field of view adjustment to the initial field of view of an initial displayed image based on the detected eye movement of the user corresponding to a successive eye direction. Further implemented instructions generate a successive displayed image of the sequence of displayed images based on the field of view adjustment. The successive displayed image is produced as visible output to the user via the user interface. This visible output appears on the see-through image displays 180C-D of optical assembly 180A-B, which is driven by image display driver 934 to present the sequence of displayed images, including the initial displayed image with the initial field of view and the successive displayed image with the successive field of view.

As shown in FIG. 16, high-speed circuitry 930 includes high-speed processor 932, memory 934, and high-speed wireless circuitry 936. In the example, the image display driver 942 is coupled to the high-speed circuitry 930 and operated by the high-speed processor 932 in order to drive the left and right image displays 180C-D of the optical assembly 180A-B. High-speed processor 932 may be any processor capable of managing high-speed communications and operation of any general computing system needed for eyewear device 100. High-speed processor 932 includes processing resources needed for managing high-speed data transfers on high-speed wireless connection 937 to a wireless local area network (WLAN) using high-speed wireless circuitry 936. In certain examples, the high-speed processor 932 executes an operating system such as a LINUX operating system or other such operating system of the eyewear device 100 and the operating system is stored in memory 934 for execution. In addition to any other responsibilities, the high-speed processor 932 executing a software architecture for the eyewear device 100 is used to manage data transfers with high-speed wireless circuitry 936. In certain examples, high-speed wireless circuitry 936 is configured to implement Institute of Electrical and Electronic Engineers (IEEE) 802.11 communication standards, also referred to herein as Wi-Fi. In other examples, other high-speed communications standards may be implemented by high-speed wireless circuitry 936.

Low-power wireless circuitry 924 and the high-speed wireless circuitry 936 of the eyewear device 100 can include short range transceivers (Bluetooth™) and wireless wide, local, or wide area network transceivers (e.g., cellular or WiFi). Mobile device 990, including the transceivers communicating via the low-power wireless connection 925 and high-speed wireless connection 937, may be implemented using details of the architecture of the eyewear device 100, as can other elements of network 995.

Memory 934 includes any storage device capable of storing various data and applications, including, among other things, color maps, camera data generated by the left and right visible light cameras 114A-B and the image processor 912, as well as images generated for display by the image display driver 942 on the see-through image displays 180C-D of the optical assembly 180A-B. While memory 934 is shown as integrated with high-speed circuitry 930, in other examples, memory 934 may be an independent stand-alone element of the eyewear device 100. In certain such examples, electrical routing lines may provide a connection through a chip that includes the high-speed processor 932 from the image processor 912 or low-power processor 922 to the memory 934. In other examples, the high-speed processor 932 may manage addressing of memory 934 such that the low-power processor 922 will boot the high-speed processor 932 any time that a read or write operation involving memory 934 is needed.

Server system 998 may be one or more computing devices as part of a service or network computing system, for example, that include a processor, a memory, and network communication interface to communicate over the network 995 with the mobile device 990 and eyewear device 100. Eyewear device 100 is connected with a host computer. For example, the eyewear device 100 is paired with the mobile device 990 via the high-speed wireless connection 937 or connected to the server system 998 via the network 995.

Output components of the eyewear device 100 include visual components, such as the left and right image displays 180C-D of optical assembly 180A-B as described in FIGS. 2C-D (e.g., a display such as a liquid crystal display (LCD), a plasma display panel (PDP), a light emitting diode (LED) display, a projector, or a waveguide). The image displays 180C-D of the optical assembly 180A-B are driven by the image display driver 942. The output components of the eyewear device 100 further include acoustic components (e.g., speakers), haptic components (e.g., a vibratory motor), other signal generators, and so forth. The input components of the eyewear device 100, the mobile device 990, and server system 998, may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or other pointing instruments), tactile input components (e.g., a physical button, a touch screen that provides location and force of touches or touch gestures, or other tactile input components), audio input components (e.g., a microphone), and the like.

Eyewear device 100 may optionally include additional peripheral device elements 919. Such peripheral device elements may include biometric sensors, additional sensors, or display elements integrated with eyewear device 100. For example, peripheral device elements 919 may include any I/O components including output components, motion components, position components, or any other such elements described herein. The eyewear device 100 can take other forms and may incorporate other types of frameworks, for example, a headgear, a headset, or a helmet.

For example, the biometric components of the user interface field of view adjustment 900 include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram based identification), and the like. The motion components include acceleration sensor components (e.g., accelerometer), gravitation sensor components, rotation sensor components (e.g., gyroscope), and so forth. The position components include location sensor components to generate location coordinates (e.g., a Global Positioning System (GPS) receiver component), WiFi or Bluetooth™ transceivers to generate positioning system coordinates, altitude sensor components (e.g., altimeters or barometers that detect air pressure from which altitude may be derived), orientation sensor components (e.g., magnetometers), and the like. Such positioning system coordinates can also be received over wireless connections 925 and 937 from the mobile device 990 via the low-power wireless circuitry 924 or high-speed wireless circuitry 936.

According to some examples, an "application" or "applications" are program(s) that execute functions defined in the programs. Various programming languages can be employed to create one or more of the applications, structured in a variety of manners, such as object-oriented programming languages (e.g., Objective-C, Java, or C++) or procedural programming languages (e.g., C or assembly language). In a specific example, a third party application (e.g., an application developed using the ANDROID™ or IOS™ software development kit (SDK) by an entity other than the vendor of the particular platform) may be mobile software running on a mobile operating system such as IOS™, ANDROID™, WINDOWS® Phone, or another mobile operating systems. In this example, the third-party application can invoke API calls provided by the operating system to facilitate functionality described herein.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, any and all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like may vary by as much as ±10% from the stated amount.

In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, the subject matter to be protected lies in less than all features of any single disclosed example. Thus, the following claims are hereby incorporated into the Detailed Description, with each claim standing on its own as a separately claimed subject matter.

While the foregoing has described what are considered to be the best mode and other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. An eyewear, comprising:
a frame;
an optical member supported by the frame;
a temple;
a hinge coupled between the frame and the temple, the hinge configured to allow rotation of the temple with respect to the frame;
an extender configured to allow the temple to extend to a hyperextended position with respect to the frame;
a protrusion extending from the frame, wherein the protrusion is configured to create a camming action and create a gap between the temple and the frame in the hyperextended position, wherein the camming action creates the gap only in the hyperextended position; and
wherein the temple includes an electrical conductor extending within the temple, the electrical conductor having a service loop configured to allow the electrical conductor to extend when the temple is extended and maintaining an electrical connection across the hinge in all positions.

2. The eyewear of claim 1, wherein the extender comprises an extension member coupled to the hinge, wherein the temple is configured to extend along the extension member when extended to the hyperextended position.

3. The eyewear of claim 2, wherein the extension member comprises an elongated member.

4. The eyewear of claim 2, further comprising a limit member configured to limit a travel distance of the temple along the extension member.

5. The eyewear of claim 4, wherein the limit member comprises a shoulder on the extension member.

6. The eyewear of claim 1, further comprising a recess commensurate in shape and size with the protrusion and configured to receive the protrusion when the temple is in an open position, wherein the protrusion is configured to slide against the recess to create the camming action.

7. The eyewear of claim 6, wherein the protrusion is configured to be removed from the recess when the temple extends to a hyperextended position.

8. An eyewear, comprising:
a frame;
an optical member supported by the frame;
a temple;
a hinge coupled between the frame and the temple, the hinge configured to allow rotation of the temple with respect to the frame;
a protrusion extending from the frame, wherein the protrusion is configured to create a camming action and create a gap between the temple and the frame;
an extender configured to allow the temple to extend to a hyperextended position with respect to the frame, wherein the extender comprises a slidable bushing encompassed by the temple, the bushing encompassing a spring; and
wherein the temple includes an electrical conductor extending within the temple, the electrical conductor having a service loop configured to allow the electrical conductor to extend when the temple is extended and maintaining an electrical connection across the hinge in all positions.

9. The eyewear of claim 8, wherein the extender comprises an extension member coupled to the hinge, wherein the temple is configured to extend along the extension member when extended to the hyperextended position, wherein the bushing is configured to extend about the extension member.

10. The eyewear of claim 8, wherein the spring is configured to enable the temple to radially extend from the hinge and also create a bias force to retract the temple toward the hinge.

11. The eyewear of claim 8, wherein the spring is configured to compress against the bushing when the bushing is extended from the hinge, and create a bias force configured to retract the temple toward the hinge.

12. The eyewear of claim 8, further comprising a recess commensurate in shape and size with the protrusion and configured to receive the protrusion when the temple is in an open position, and wherein the protrusion is configured to slide against the recess to create the camming action.

13. The eyewear of claim 12, wherein the temple comprises a temple surface, wherein the temple surface is positioned between the frame and the temple, wherein the temple surface comprises the recess.

14. An eyewear, comprising:
a frame;
an optical member supported by the frame;
a temple;
a hinge coupled between the frame and the temple, the hinge configured to allow rotation of the temple with respect to the frame;
an extender coupled to the hinge and configured to allow the temple to radially extend away from the hinge;
a protrusion extending from a midsection of a surface of the frame having edges and disposed between the frame and the temple, wherein a cross section of the protrusion is round, wherein the protrusion is configured to create a camming action, and wherein the protrusion is spaced from each of the edges of the surface; and
wherein the temple includes an electrical conductor extending within the temple, the electrical conductor having a service loop configured to allow the electrical conductor to extend when the temple is extended and maintaining an electrical connection across the hinge in all positions.

15. The eyewear of claim 14, wherein the extender comprises a longitudinally extending member extending away from the hinge.

16. The eyewear of claim 15, further comprising a bushing slidably coupled to the longitudinally extending member and a spring coupled to the bushing.

17. The eyewear of claim 16, wherein the spring is configured to enable the temple to radially extend from the hinge, and also create a bias force to retract the temple toward the hinge.

18. The eyewear of claim 16, wherein the spring is configured to compress against the bushing when the bushing is extended from the hinge, and create a bias force configured to retract the temple toward the hinge.

19. The eyewear of claim 14, further comprising a recess commensurate in shape and size with the protrusion and configured to receive the protrusion when the temple is in an open position, and wherein the protrusion is configured to slide against the recess to create the camming action.

20. The eyewear of claim 19, wherein the temple comprises a temple surface, wherein the temple surface is positioned between the frame and the temple, wherein the temple surface comprises the recess.

* * * * *